(12) United States Patent
Kuroda

(10) Patent No.: US 9,209,107 B2
(45) Date of Patent: Dec. 8, 2015

(54) ELECTRONIC DEVICE, DISPLAY DEVICE, AND TELEVISION RECEIVER

(75) Inventor: Tatsuro Kuroda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 233 days.

(21) Appl. No.: 13/698,306

(22) PCT Filed: May 30, 2011

(86) PCT No.: PCT/JP2011/062334
§ 371 (c)(1),
(2), (4) Date: Nov. 16, 2012

(87) PCT Pub. No.: WO2011/158638
PCT Pub. Date: Dec. 22, 2011

(65) Prior Publication Data
US 2013/0057784 A1    Mar. 7, 2013

(30) Foreign Application Priority Data

Jun. 14, 2010 (JP) ................. 2010-135392

(51) Int. Cl.
*H01L 23/12* (2006.01)
*H01L 23/40* (2006.01)
(Continued)

(52) U.S. Cl.
CPC .......... *H01L 23/40* (2013.01); *G02F 1/133308* (2013.01); *H01L 23/3675* (2013.01); *H01L 23/4006* (2013.01); *G02F 1/13452* (2013.01);
(Continued)

(58) Field of Classification Search
CPC ............... H01L 2924/01079; H01L 23/10; H01L 2224/16; H01L 24/72; H01L 23/3121; H01L 23/4334; H01L 23/49524

USPC ................... 257/E23.084, E23.101, E23.103, 257/E23.105, E23.181, 688, 704, 706, 707, 257/711, 727; 438/108, 121, 122, 125, 612, 438/796; 348/E05.128, 739, 836; 361/719; 257/675, 712
See application file for complete search history.

(56) References Cited

U.S. PATENT DOCUMENTS 5,365,107 A * 11/1994 Kuraishi et al. ............... 257/673
5,616,957 A *  4/1997 Kajihara ....................... 257/712
(Continued)

FOREIGN PATENT DOCUMENTS

JP      02-170494 A     7/1990
JP      07-079082 A     3/1995
(Continued)

OTHER PUBLICATIONS

Official Communication issued in International Patent Application No. PCT/JP2011/062334, mailed on Aug. 16, 2011.

*Primary Examiner* — Kenneth Parker
*Assistant Examiner* — Young Kim
(74) *Attorney, Agent, or Firm* — Keating & Bennett, LLP

(57) ABSTRACT

Provided is an electronic device whereby it is possible to suppress a decline in heat-dissipating properties. This liquid crystal display device (electronic device) (1) is provided with a semiconductor element (6a, 6b), a substrate (7) to which the semiconductor element is attached, and a chassis (5) disposed in opposition to the substrate and furnished with a rib (11, 12) that protrudes towards the semiconductor element side. The rib includes a contact part (11a, 12a) for contacting the semiconductor element. A pressing member (9) for inducing the semiconductor element into contact with the contact part is furnished at least at a position corresponding to the center part (7c) of the substrate.

19 Claims, 17 Drawing Sheets

(51) Int. Cl.
    *G02F 1/1333*     (2006.01)
    *H01L 23/367*     (2006.01)
    *G02F 1/1335*     (2006.01)
    *G02F 1/1345*     (2006.01)

(52) U.S. Cl.
    CPC ............ *G02F 1/133604* (2013.01); *G02F 2001/133314* (2013.01); *H01L 2924/0002* (2013.01)

(56) References Cited

U.S. PATENT DOCUMENTS

| | | | |
|---|---|---|---|
| 6,297,549 B1* | 10/2001 | Hiyoshi | 257/703 |
| 6,713,844 B2* | 3/2004 | Tatsuta et al. | 257/629 |
| 6,818,982 B2* | 11/2004 | Kim | 257/707 |
| 7,054,158 B2* | 5/2006 | Kimmich | H01L 23/4093 165/185 |
| 7,126,218 B1* | 10/2006 | Darveaux et al. | 257/706 |
| 7,230,831 B2* | 6/2007 | Luckner et al. | 361/719 |
| 7,355,858 B2* | 4/2008 | Gruendler et al. | 361/715 |
| 7,675,167 B2* | 3/2010 | Schlomann | 257/727 |
| 8,354,740 B2* | 1/2013 | Liu | H01L 23/49524 257/675 |
| 8,395,254 B2* | 3/2013 | Espiritu | H01L 23/4334 257/706 |
| 8,610,262 B1* | 12/2013 | McLellan et al. | 257/706 |
| 2002/0190397 A1* | 12/2002 | Kim | H01L 23/3121 257/796 |
| 2005/0128713 A1* | 6/2005 | Schmidberger | H01L 23/4006 361/719 |
| 2008/0012045 A1* | 1/2008 | Muto et al. | 257/177 |
| 2009/0067131 A1 | 3/2009 | Yasuda et al. | |
| 2009/0267222 A1* | 10/2009 | Zhong et al. | 257/707 |
| 2009/0316063 A1 | 12/2009 | Watanabe | |
| 2011/0089558 A1* | 4/2011 | Muto | H01L 24/40 257/712 |
| 2012/0126387 A1* | 5/2012 | Fishley et al. | 257/690 |
| 2013/0070166 A1* | 3/2013 | Kuroda | F21V 21/00 348/739 |

FOREIGN PATENT DOCUMENTS

| | | |
|---|---|---|
| JP | 10-308484 A | 11/1998 |
| JP | 11-163566 A | 6/1999 |
| JP | 2002-217343 A | 8/2002 |
| JP | 2002-324989 A | 11/2002 |
| JP | 2005-116650 A | 4/2005 |
| JP | 2009-070999 A | 4/2009 |
| JP | 2009-295706 A | 12/2009 |
| JP | 2010-002745 A | 1/2010 |

* cited by examiner

ELECTRONIC DEVICE, DISPLAY DEVICE, AND TELEVISION RECEIVER

TECHNICAL FIELD

The present invention relates to an electronic device, a display device, and a television receiver, and relates in particular to an electronic device provided with a substrate to which semiconductor elements are attached, a display device, and a television receiver.

BACKGROUND ART

Electronic devices provided with a substrate to which semiconductor elements are attached are conventionally known. FIG. 36 is a cross-sectional view showing a structure of an electronic device according to a conventional example, the electronic device provided with a substrate to which semiconductor elements are attached.

As shown in FIG. 36, the electronic device 2001 according to the conventional example has a plurality of semiconductor elements 2002, a substrate 2003 to which the plurality of semiconductor elements 2002 are attached, heat-dissipating sheets 2004 disposed over the semiconductor elements 2002, a metal plate 2005 that contacts the semiconductor elements 2002 via the heat-dissipating sheets 2004, and a chassis 2006 disposed a predetermined distance away from the substrate 2003.

The plurality of semiconductor elements 2002 include a semiconductor element 2002a and a semiconductor element 2002b having mutually different thicknesses. For example, the semiconductor element 2002b has a greater thickness than the semiconductor element 2002a.

The plurality of heat-dissipating sheets 2004 include a heat-dissipating sheet 2004a disposed over the semiconductor element 2002a, and a heat-dissipating sheet 2004b disposed over the semiconductor element 2002b.

A plurality of protruding parts 2005a and 2005b that protrude towards the substrate 2003 side are formed on the metal plate 2005. The plurality of protruding parts 2005a and 2005b are formed to have mutually different protruding heights, for example, the protruding part 2005b has a lesser protruding height than the protruding part 2005a.

Moreover, the protruding part 2005a is formed at a position in opposition to the semiconductor element 2002a, while the protruding part 2005b is formed at a position in opposition to the semiconductor element 2002b. The semiconductor element 2002a contacts the protruding part 2005a via the heat-dissipating sheet 2004a, and the semiconductor element 2002b contacts the protruding part 2005b via the heat-dissipating sheet 2004b. By so doing, it is possible for the heat generated by the semiconductor elements 2002 to be dissipated to the metal plate 2005.

The substrate 2003 and the metal plate 2005 are fixed to the chassis 2006 by fixing members (not shown).

Structures for dissipating heat generated by semiconductor elements into a metal plate are disclosed, for example, in Patent Literature 1 and Patent Literature 2.

LIST OF CITATIONS

Patent Literature

Patent Literature 1: Japanese Laid-Open Patent Application No. 10-308484

Patent Literature 2: Japanese Laid-Open Patent Application No. 2010-2745 (paragraph 0056)

SUMMARY OF INVENTION

Technical Problem

However, in the electronic device 2001 according to the conventional example, there are cases in which, due to production variations or the like, the protruding parts 2005a and 2005b do not contact the semiconductor elements 2002 (the heat-dissipating sheets 2004).

For example, as shown in FIG. 37, there are cases in which, due to a production variation, the protruding height of the protruding part 2005a is less than a design value, so that the protruding part 2005a does not contact the semiconductor element 2002a (the heat-dissipating sheet 2004a). This leads to the problem of difficulty in dissipating heat generated by the semiconductor element 2002a into the metal plate 2005.

The present invention was devised to solve the foregoing problems, and it is an object thereof to provide an electronic device, a display device, and a television receiver whereby it is possible to suppress a decline in heat-dissipating properties.

Solution to Problem

In order to achieve the aforementioned object, an electronic device according to a first aspect of the present invention is provided with a semiconductor element; a substrate to which the semiconductor element is attached; and a metal plate disposed in opposition to the substrate and furnished with a first protruding part protruding towards the semiconductor element side; the first protruding part including a contact part for contacting the semiconductor element; and a contact-inducing member for inducing the semiconductor element into contact with the contact part being furnished at least at a position corresponding to the center part of the substrate.

In the electronic device according to this first aspect, the metal plate is furnished with the first protruding part including the contact part that contacts the semiconductor element in the aforedescribed manner, and heat generated by the semiconductor element can therefore be dissipated into the metal plate.

Moreover, by furnishing the metal plate with the first protruding part including a contact part for contacting the semiconductor element, in a case in which, for example, a plurality of semiconductor elements having mutually different thicknesses are attached to a substrate, all of the semiconductor elements can easily be made to contact the metal plate (the first protruding part) by setting the individual protruding height of each of the plurality of first protruding parts to match the thickness of the semiconductor elements contacted thereby.

Moreover, in the electronic device according to the first aspect, a contact-inducing member for inducing the semiconductor element into contact with the contact parts is furnished at least at a position corresponding to the center part of the substrate in the aforedescribed manner. By so doing, in a case in which, for example, the protruding height of a first protruding part is less than the design value due to a production variation, the semiconductor element can be induced into contact with the contact part (the first protruding part) by the contact-inducing member. As a result, instances in which heat generated by the semiconductor element fails to dissipate into the metal plate can be suppressed, and therefore decline in heat-dissipating properties of the electronic device can be suppressed.

In the electronic device according to the first aspect, the contact-inducing member preferably has a function of depressing the center part of the substrate towards the metal plate side. According to this constitution, the contact-inducing member can more easily induce the semiconductor element into contact with the contact part.

In the electronic device in which the contact-inducing member has a function of depressing the center part of the substrate towards the metal plate side, the contact-inducing member preferably includes a pressing member disposed on a face of the substrate on the side thereof opposite the metal plate, and adapted to depress the center part of the substrate towards the metal plate side. According to this constitution, the center part of the substrate can be easily depressed towards the metal plate side by the contact-inducing member.

In the electronic device in which the contact-inducing member includes the pressing member, the pressing member preferably includes a second protruding part that protrudes towards the substrate side and is adapted to depress the center part of the substrate. According to this constitution, the center part of the substrate can be more easily depressed towards the metal plate side by the pressing member.

In the electronic device in which the contact-inducing member has the function of depressing the center part of the substrate towards the metal plate side, the contact-inducing member preferably includes at least one of a screw and a band for attachment to the substrate and the metal plate. According to this constitution, the semiconductor element can easily be induced into contact with the contact part by the contact-inducing member.

In the electronic device according to the first aspect, the contact-inducing member preferably includes a spring part furnished at least to the first protruding part, and adapted to urge the contact part towards the semiconductor element side. According to this constitution, the contact part can be urged towards the semiconductor element side by the spring part, and therefore the semiconductor element can easily be induced into contact with the contact part.

In the electronic device in which the contact-inducing member includes a spring part, the first protruding part is preferably formed by bending the metal plate. According to this constitution, the first protruding part that protrudes towards the semiconductor element side can be easily formed in the metal plate, and the spring part for urging the contact part towards the semiconductor element side can be easily formed in the first protruding part.

In the electronic device in which the contact-inducing member includes a spring part, a cutout part is preferably formed at a periphery of the first protruding part of the metal plate; and the metal plate is furnished with a first heat-transmitting member that spans the cutout part and contacts the first protruding part and a section of the metal plate other than the first protruding part. In a case in which a cutout part is formed at the periphery of the first protruding part, heat generated by the semiconductor element is transmitted (dissipated) in directions other than that in which the cutout portion has been formed; however, by furnishing a first heat-transmitting member that spans the cutout part and contacts the first protruding part and a section of the metal plate other than the first protruding part in the aforedescribed manner, heat generated by the semiconductor element can be transmitted (dissipated) in directions other than that in which the cutout portion has been formed and in a direction in which the cutout portion has been formed (the direction in which the first heat-transmitting member has been furnished). By so doing, the heat-dissipating properties of the electronic device can be improved.

In the electronic device according to the first aspect, the contact-inducing member preferably includes a first adhesive layer for adhering the substrate and the metal plate to each other. According to this constitution, separation of the substrate from the metal plate can be suppressed, and therefore the semiconductor element can be easily induced into contact with the contact part.

In the electronic device according to the first aspect, a third protruding part that protrudes towards the substrate side is preferably furnished to the metal plate at positions thereof corresponding to an edge part of the substrate, and the edge part of the substrate is attached to the third protruding part of the metal plate. According to this constitution, a gap can be formed between the center part of the substrate and the metal plate, and therefore the semiconductor element can be disposed in this gap.

In the electronic device in which the edge part of the substrate is attached to the third protruding part of the metal plate, a first elastic body for adjusting a distance from the metal plate to the substrate is preferably furnished between the third protruding part and the substrate. According to this constitution, the distance from the contact part of the first protruding part to the substrate can be adjusted, and therefore the contact pressure between the semiconductor element and the contact part can be adjusted.

In the electronic device according to the first aspect, the first protruding part is preferably attached to the metal plate via a second elastic body for adjusting the distance from the first protruding part to the metal plate. According to this constitution, the distance from the first protruding part to the metal plate can be adjusted, and therefore the distance from the first protruding part to the substrate can be adjusted. By so doing, the contact pressure between the semiconductor elements and the contact part can be adjusted.

In the electronic device according to the first aspect, the metal plate is preferably furnished with a heat-dissipating fin. According to this constitution, the heat-dissipating properties of the electronic device can be further improved.

In the electronic device in which the metal plate is furnished with the heat-dissipating fin, the heat-dissipating fin is preferably formed by being cut from the metal plate. According to this constitution, the heat-dissipating fin can be easily formed in the metal plate.

In the electronic device according to the first aspect, the semiconductor element is preferably furnished as a plurality; the substrate includes a plurality of element-mounting parts for mounting of the plurality of semiconductor elements; and the contact-inducing member is furnished at least one of a position corresponding to the element-mounting parts and a position corresponding to a section between the plurality of element-mounting parts. According to this constitution, the semiconductor elements can be more reliably induced into contact with the first protruding parts by the contact-inducing member.

In the electronic device according to the first aspect, a second heat-transmitting member is preferably disposed between the semiconductor elements and the first protruding parts, and the first protruding parts contact the semiconductor elements via the second heat-transmitting member. According to this constitution, heat emitted by the semiconductor elements can be readily transmitted (dissipated) to the first protruding parts, and therefore the heat-dissipating properties of the electronic device can be improved.

In the electronic device in which a second heat-transmitting member is furnished between the semiconductor elements and the first protruding parts, a through-hole is preferably formed in the contact part. According to this constitution, during attachment of the substrate to the metal plate, it can be verified from the metal plate side whether the second heat-transmitting member has been disposed over the semiconductor elements.

In the electronic device in which a second heat-transmitting member is furnished between the semiconductor elements and the first protruding parts, a second adhesive layer is preferably disposed between the second heat-transmitting member and the first protruding parts. According to this constitution, good contact can be maintained between the second heat-transmitting member and the first protruding parts, and therefore heat emitted by the semiconductor elements can be more readily transmitted (dissipated) to the first protruding parts. By so doing, the heat-dissipating properties of the electronic device can be improved.

A display device according to a second aspect of this invention is provided with the electronic device of the aforementioned constitution. According to this constitution, there can be obtained a display device with which it is possible to suppress a decline in heat-dissipating properties.

A television receiver according to a third aspect of this invention is provided with the display device of the aforementioned constitution and a support member for supporting the display device. According to this constitution, there can be obtained a television receiver with which it is possible to suppress a decline in heat-dissipating properties.

In the television receiver according to the aforementioned third aspect, the support member preferably includes the contact-inducing member for depressing the center part of the substrate towards the metal plate side. According to this constitution, the support member can serve concomitantly as the contact-inducing member, and therefore, an increase in the number of parts can be suppressed.

In the television receiver according to the aforementioned third aspect, the support member is preferably furnished with a heat-dissipating fin. According to this constitution, the heat-dissipating properties of the television receiver can be further improved.

Advantageous Effects of the Invention

According to the present invention as set forth above, there can be obtained an electronic device, a display device, and a television receiver, with which it is possible to suppress a decline in heat-dissipating properties.

DESCRIPTION OF EMBODIMENTS

Embodiments of the present invention are described below with reference to the drawings. For convenience, hatching is not provided in some cases even in cross sectional views, while in other cases hatching is provided even in plan views.

First Embodiment

A structure of a liquid crystal display device 1 according to a first embodiment of the present invention is described with reference to FIGS. 1 to 5.

Figure 1:
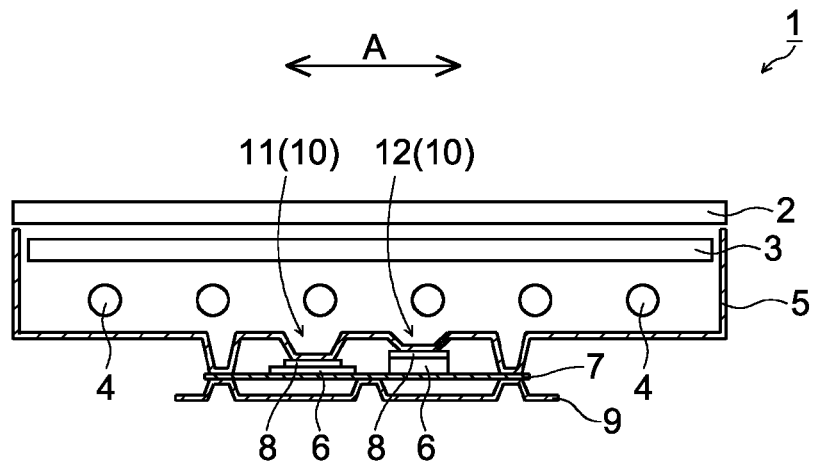
FIG. 1 is a cross-sectional view showing a structure of a liquid crystal display device according to a first embodiment of the present invention.

The liquid crystal display device 1 according to a first embodiment of the present invention constitutes, for example, a liquid crystal television receiver (not illustrated), and the like. As shown in FIG. 1, the liquid crystal display device 1 is constituted by a liquid crystal display panel 2; an optical sheet 3 and a plurality of light sources 4 disposed on the rear-face (back-face) side of the liquid crystal display panel 2; a sheet-metal chassis 5 for housing the optical sheet 3 and the plurality of light sources 4; a plurality of semiconductor elements 6 disposed on the exterior part of the chassis 5; a substrate 7 disposed in opposition to the chassis 5, and to which the plurality of semiconductor elements 6 are attached; heat-transmitting members 8 disposed over the semiconductor elements 6; and a sheet-metal pressing member 9 disposed on the rear-face (back-face) side of the substrate 7. The optical sheet 3, the plurality of light sources 4, the chassis 5, and the like, constitute a direct-type backlight device. The liquid crystal display device 1 is an example of the "electronic device" and the "display device" of the present invention, and the chassis 5 is an example of the "metal sheet" of the present invention. The heat-transmitting members 8 (8a, 8b) are an example of the "second heat-transmitting members" of the present invention, and the pressing member 9 is an example of the "contact-inducing member" of the present invention.

The liquid crystal display panel 2 comprises a liquid crystal layer, which is not illustrated, sandwiched by two glass substrates. The liquid crystal display panel 2 functions as a display panel by being illuminated by the light sources 4.

The optical sheet 3 is constituted, for example, by a plurality of sheet types such as prism sheets, lens sheets, or the like.

The light sources 4 are formed by fluorescent lamps, for example. However, the light sources 4 may be formed, for example, from light emitting diodes (LED) or the like, instead of fluorescent lamps. A reflecting sheet (not illustrated) may be disposed on the back-face side of the light sources 4.

Figure 2:
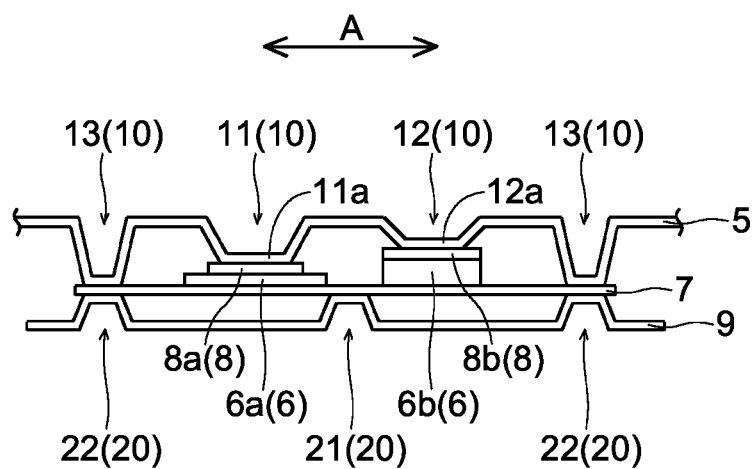
FIG. 2 is a cross-sectional view showing a structure in the vicinity of the substrate shown in FIG. 1.

In the first embodiment, a plurality of ribs 10 that protrude towards the substrate 7 side (the outside) are formed in the chassis 5, as shown in FIG. 2. The plurality of ribs 10 are formed by a deep drawing process, for example.

The plurality of ribs 10 include ribs 11 and 12 that contact the semiconductor elements 6 via the heat-transmitting members 8, and a plurality of ribs 13 disposed at positions corresponding to edge parts 7d (see FIG. 3), discussed later, of the substrate 7 of the chassis 5 (positions directly above the edge parts 7d). The ribs 11 and 12 are an example of the "first protruding parts" of the present invention, and the ribs 13 are an example of the "third protruding parts" of the present invention.

The ribs 11 and 12 are formed so as to have mutually different protruding heights (height in the thickness direction); for example, the rib 12 has a shorter protruding height than the rib 11.

The rib 11 is formed at a position in opposition to a semiconductor element 6a, discussed later, while the rib 12 is formed at a position in opposition to a semiconductor element 6b, discussed later. Contact parts 11a and 12a for contacting the semiconductor elements 6 (the heat-transmitting members 8) are respectively formed on the ribs 11 and 12. The contact parts 11a and 12a are formed to a flat profile, for example.

The plurality of ribs 13 are formed so as to have a mutually identical protruding height. The plurality of ribs 13 have a greater protruding height than do the ribs 11 and 12. The protruding height of the plurality of ribs 13 is set to a size about equal to a value that combines the protruding height of the rib 11 (or the rib 12), the thickness of a heat-transmitting member 8a (or a heat-transmitting member 8b), discussed later, and the thickness of the semiconductor element 6a (or the semiconductor element 6b), discussed later.

The plurality of semiconductor elements 6 are elements for performing processes, for example, frame rate control (FRC) or the like, and the amount of heat emitted during operation is considerable. The plurality of semiconductor elements 6 includes the semiconductor element 6a and the semiconductor element 6b having mutually different thicknesses. For example, the semiconductor element 6b has a greater thickness than the semiconductor element 6a.

The heat-transmitting members 8 are formed, for example, from a heat-dissipating sheet (heat-conducting sheet) having high heat conductivity. The heat-transmitting members 8 are formed to be elastically deformable, permitting compression when depressed.

The plurality of heat-transmitting members 8 include the heat-transmitting member 8a disposed over the semiconductor element 6a, and the heat-transmitting member 8b disposed over the semiconductor element 6b.

The semiconductor element 6a contacts the contact part 11a of the rib 11 via the heat-transmitting member 8a, while the semiconductor element 6b contacts the contact part 12a of the rib 12 via the heat-transmitting member 8b.

Figure 3:
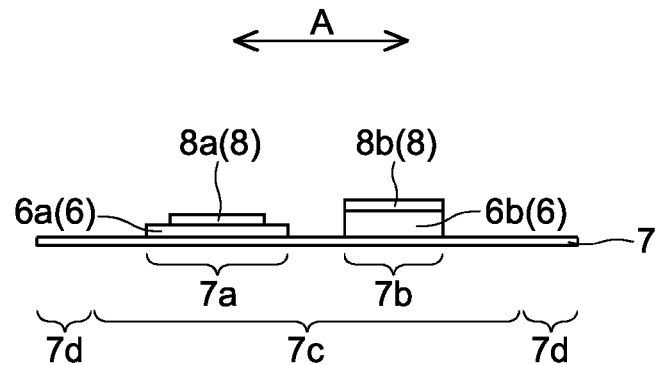
FIG. 3 is a cross-sectional view showing the structure of the substrate shown in FIG. 1.

As shown in FIG. 3, the substrate 7 includes a center part 7c that includes element-mounting parts 7a and 7b to which the plurality of semiconductor elements 6a and 6b are respectively attached; and edge parts 7d (sections other than the center part 7c).

Figure 4:
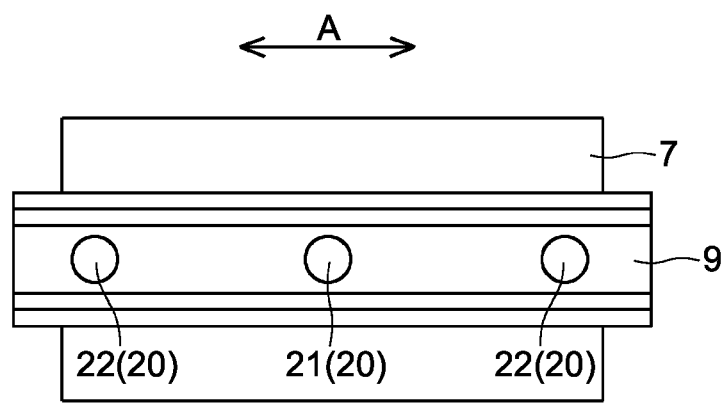
FIG. 4 is a bottom view showing the structure of the substrate and the pressing member shown in FIG. 1.
Figure 5:
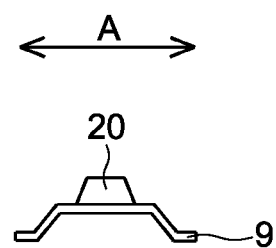
FIG. 5 is a side view showing the structure of the pressing member shown in FIG. 1.

As shown in FIG. 2, the pressing member 9 is disposed on the rear-face (the face opposite from the chassis 5) side of the substrate 7. As shown in FIG. 2 and FIG. 4, the pressing member 9 is formed, for example, so as to extend along the direction (direction A) in which the semiconductor elements 6 are disposed. As shown in FIG. 5, the pressing member 9 is formed so as to have a stepped shape, as viewed from the lengthwise direction (direction A). By so doing, it is possible to suppress bowing of the pressing member 9 in the depression direction (thickness direction).

In the first embodiment, a plurality of ribs 20 that protrude towards the substrate 7 side (the chassis 5 side) are formed on the pressing member 9, as shown in FIG. 2. The plurality of ribs 20 are formed by a deep drawing process, for example.

The plurality of ribs 20 include a rib 21 for depressing the rear face of the center part 7c (see FIG. 3) of the substrate 7, and a plurality of ribs 22 disposed at positions (positions directly below the edge parts 7d) on the pressing member 9 that correspond to the edge parts 7d of the substrate 7. The rib 21 is an example of the "second protruding part" of the present invention.

The rib 21 is formed so as to have a protruding height identical to, or slightly greater than, that of the plurality of ribs 22.

The rib 21 is formed on the pressing member 9 at a position (a position directly below the center part 7c) corresponding to the center part 7c of the substrate 7. In preferred practice, the rib 21 is formed at a position (a position directly below the element-mounting part 7a or 7b) corresponding to the element-mounting part 7a or 7b of the substrate 7, or at a position corresponding to a section between the element-mounting parts 7a and 7b of the substrate 7.

The ribs 22 are formed on the pressing member 9 at positions (positions directly below the edge parts 7d) corresponding to the edge parts 7d of the substrate 7. The ribs 22 are formed on the pressing member 9 at positions (positions directly below the ribs 13) corresponding to the ribs 13 of the chassis 5.

The ribs 22 of the pressing member 9 and the edge parts 7d of the substrate 7 are fixed to the ribs 13 of the chassis 5 by screws or the like (not shown).

In the first embodiment, heat generated by the semiconductor elements 6a and 6b can be dissipated into the chassis 5 by furnishing the chassis 5 with a rib 11 for contacting the semiconductor element 6a and a rib 12 for contacting the semiconductor element 6b, in the aforedescribed manner.

Moreover, the chassis 5 is furnished with the rib 11 for contacting the semiconductor element 6a and the rib 12 for contacting the semiconductor element 6b, whereby even in a case in which the semiconductor elements 6a and 6b have mutually different thicknesses, all of the semiconductor elements 6 (6a and 6b) can easily be induced to contact the chassis 5 (the ribs 11 and 12) by setting the individual protruding height of each of the ribs 11 and 12 to match the thickness of the semiconductor elements 6a and 6b contacted thereby.

Moreover, in the first embodiment, there is furnished the pressing member 9, which depresses the center part 7c of the substrate 7 towards the chassis 5 side, in the aforedescribed manner. By so doing, even in a case in which, for example, the protruding height of the rib 11 (or the rib 12) is less than the design value due to a production variation, the semiconductor element 6a (or the semiconductor element 6b) can be induced into contact with the contact part 11a (or the contact part 12a) by the pressing member 9. As a result, instances in which heat generated by the semiconductor element 6a (or the semiconductor element 6b) fails to dissipate into the chassis 5 can be suppressed, and therefore a decline in heat-dissipating properties of the liquid crystal display device 1 can be suppressed.

Moreover, in a case in which, for example, the protruding height of the rib 12 (or the rib 11) is greater than the design value due to a production variation, it becomes difficult for the semiconductor element 6a (or the semiconductor element 6b) to contact the contact part 11a (or the contact part 12a). However, in the first embodiment, the semiconductor element 6a (or the semiconductor element 6b) can be induced into contact with the contact part 11a (or the contact part 12a) by the pressing member 9. As a result, instances in which heat generated by the semiconductor element 6a (or the semiconductor element 6b) fails to dissipate into the chassis 5 can be suppressed, and therefore decline in heat-dissipating properties of the liquid crystal display device 1 can be suppressed.

The chassis 5 employed in the liquid crystal display device 1 (electronic device) is very strong and resistant to deformation. For this reason, deflection of the chassis 5 towards the side (the top side) opposite from the substrate 7 when the substrate 7 is depressed by the pressing member 9 can be suppressed. By so doing, instances in which the semiconductor elements 6 (6a and 6b) do not readily contact the chassis 5 (the ribs 11 and 12) can be suppressed.

Moreover, in the first embodiment, the semiconductor elements 6 emit a considerable amount of heat, and it is therefore particularly effective for the liquid crystal display device 1 to be constituted in the aforedescribed manner.

Moreover, in the first embodiment, forming the rib 21 to protrude from the pressing member 9 towards the substrate 7 side in the aforedescribed manner, allows the center part 7c of the substrate 7 to be easily depressed towards the chassis 5 side by the pressing member 9.

Moreover, in the first embodiment, the ribs 13 that protrude towards the substrate 7 side are furnished to the chassis 5 at positions corresponding to the edge parts 7d of the substrate 7, and the edge parts 7d of the substrate 7 are attached to the ribs 13 of the chassis 5 in the aforedescribed manner. By so doing, a gap can be formed between the center part 7c of the substrate 7 and the chassis 5, and the semiconductor elements 6 (6a and 6b) can be disposed in this gap.

Moreover, in the first embodiment, when the rib 21 is formed on the pressing member 9 at a position (a position directly below the element-mounting part 7a or 7b) corresponding to the element-mounting part 7a or 7b of the substrate 7, or at a position corresponding to a section between the element-mounting parts 7a and 7b of the substrate 7 in the aforedescribed manner, the semiconductor elements 6 (6a and 6b) can be more reliably induced into contact with the ribs 11 and 12 by the pressing member 9.

Moreover, in the first embodiment, disposing the heat-transmitting members 8 (8a and 8b) between the semiconductor elements 6 (6a and 6b) and the ribs 11 and 12 in the aforedescribed manner, allows heat generated by the semiconductor elements 6 (6a and 6b) to be easily transmitted (dissipated) to the ribs 11 and 12, and the heat-dissipating properties of the liquid crystal display device 1 can therefore be improved.

Moreover, in the aforedescribed manner, the heat-transmitting members 8 (8a and 8b) disposed between the semiconductor elements 6 (6a and 6b) and the ribs 11 and 12 are elastically deformable. By so doing, in a case in which, for example, the protruding height of the rib 11 is less than the design value, compressive deformation can be induced in the heat-transmitting member 8b that contacts the rib 12 (the conducting member 8b can be reduced in thickness) when the substrate 7 is depressed towards the semiconductor element 6 (6a and 6b) side by the pressing member 9. By so doing, the rib 11, the protruding height of which is less than the design value, can be more reliably induced into contact with the semiconductor element 6a via the heat-transmitting member 8a.

Second Embodiment

Figure 7:
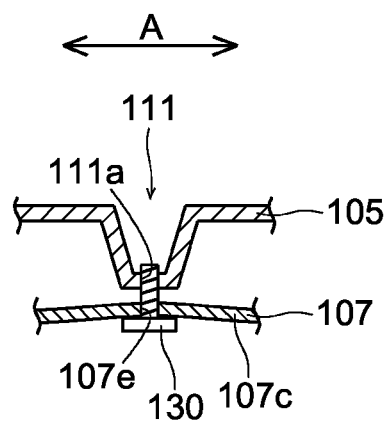
FIG. 7 is an enlarged cross-sectional view describing the structure in the vicinity of the substrate shown in FIG. 6.
Figure 8:
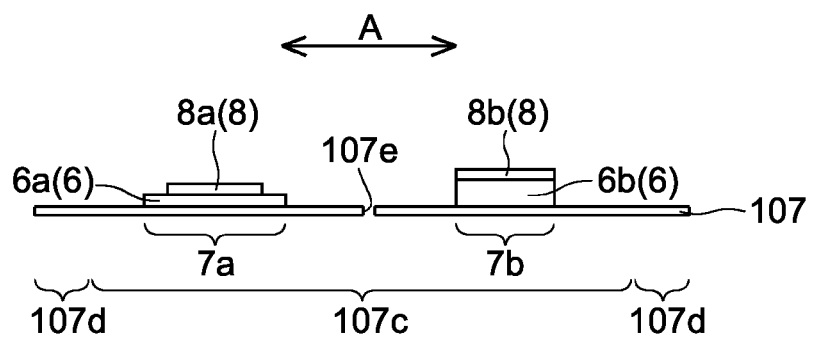
FIG. 8 is a cross-sectional view showing the structure of the substrate shown in FIG. 6.

In this second embodiment, there is described with reference to FIGS. 6 to 8 a case that differs from the aforedescribed first embodiment in that a screw 130 is employed in place of the sheet-metal pressing member 9 in order to depress a substrate 107 (semiconductor elements 6) towards a chassis 105 side.

Figure 6:
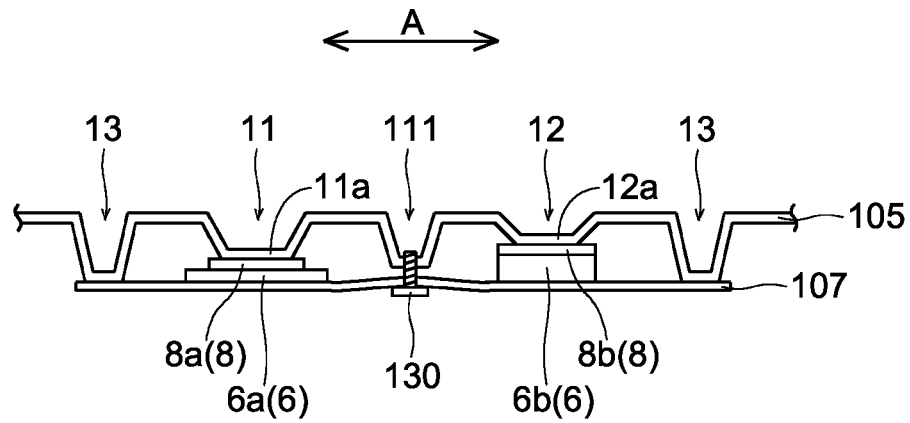
FIG. 6 is a cross-sectional view showing the structure in the vicinity of the substrate of a liquid crystal display device according to a second embodiment of the present invention.

In the second embodiment, a rib 111 that protrudes towards the substrate 107 side (the outside) is formed on the chassis 105 between the rib 11 and the rib 12, as shown in FIG. 6. This rib 111 has a protruding height that is less than that of the plurality of ribs 13. As shown in FIG. 7, a screw hole 111a is formed in the rib 111. A screw thread may be formed in this screw hole 111a. The chassis 105 is an example of the "metal plate" of the present invention.

A screw hole 107e is formed in a center part 107c of the substrate 107 at a position corresponding to the screw hole 111a of the chassis 105. The screw 130 is attached to this screw hole 107e (the substrate 107) and to the screw hole 111a (the chassis 105), and the center part 107c of the substrate 107 (the section between the element-mounting parts 7a and 7b (see FIG. 8)) is depressed towards the chassis 105 side by the screw 130. Because of this, the center part 107c of the substrate 107 (the section between the element-mounting parts 7a and 7b) bows towards the chassis 105 side. The screw 130 is an example of the "contact-inducing member" of the present invention.

As shown in FIG. 6, edge parts 107d of the substrate 107 (see FIG. 8) are fixed to the ribs 13 of the chassis 105 with screws or the like (not shown).

Other structures of the second embodiment are analogous to those of the aforedescribed first embodiment.

In the second embodiment, furnishing the screw 130 for attachment to the substrate 107 and the chassis 105 in the aforedescribed manner, allows the semiconductor elements 6a and 6b to be easily induced into contact with the contact parts 11a and 12a by the screw 130. Moreover, employing the screw 130, allows the liquid crystal display device to be more compact and lighter in weight, as compared with the aforedescribed first embodiment.

Other advantageous effects of the second embodiment are analogous to those of the aforedescribed first embodiment.

Third Embodiment

Figure 10:
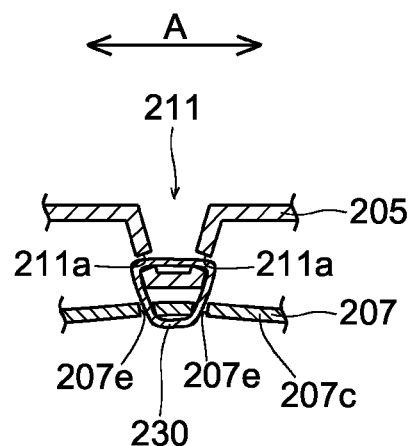
FIG. 10 is an enlarged cross-sectional view describing the structure in the vicinity of the substrate shown in FIG. 9.
Figure 11:
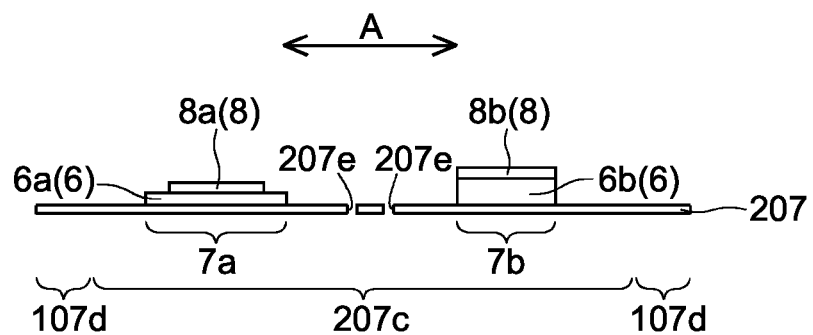
FIG. 11 is a cross-sectional view showing the structure of the substrate shown in FIG. 9.

In this third embodiment, there is described with reference to FIGS. 9 to 11 a case that differs from the aforedescribed first and second embodiments in that a band 230 is employed in order to depress a substrate 207 (semiconductor elements 6) towards a chassis 205 side.

Figure 9:
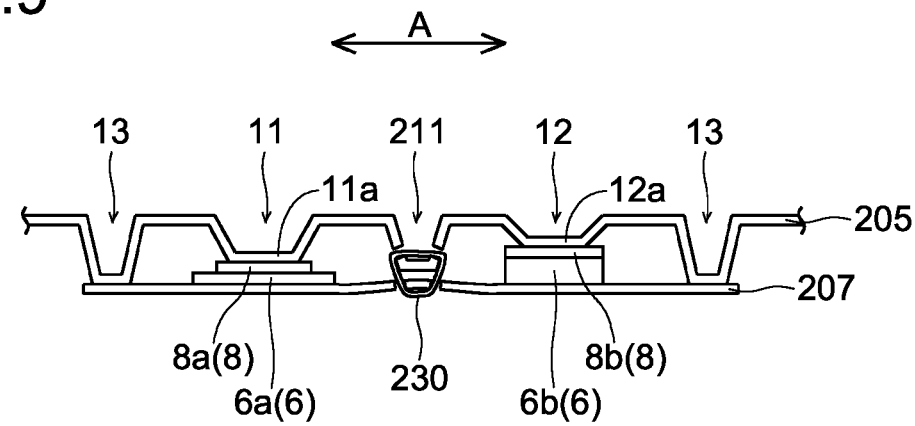
FIG. 9 is a cross-sectional view showing the structure in the vicinity of the substrate of a liquid crystal display device according to a third embodiment of the present invention.

In the third embodiment, a rib 211 that protrudes towards the substrate 207 side (the outside) is formed on the chassis 205 between the rib 11 and the rib 12, as shown in FIG. 9. This rib 211 has a protruding height that is less than that of the plurality of ribs 13. As shown in FIG. 10, a band attachment hole 211a is formed in the rib 211. The chassis 205 is an example of the "metal plate" of the present invention.

A band attachment hole 207e is formed in a center part 207c of the substrate 207 in the vicinity of the band attachment hole 211a of the chassis 205. The band 230 is attached to this band attachment hole 207e and to the band attachment hole 211a, and the center part 207c of the substrate 207 (the section between the element-mounting parts 7a and 7b (see FIG. 11)) is depressed towards the chassis 205 side by the band 230. Because of this, the center part 207c of the substrate 207 (the section between the element-mounting parts 7a and 7b) bows towards the chassis 205 side. The band 230 is an example of the "contact-inducing member" of the present invention.

The band 230 may be formed, for example, using a tie band such as TY-RAP™ or the like, or by a heat shrinkable band that shrinks when heated.

Other structures of the third embodiment are analogous to those of the aforedescribed first and second embodiments.

In the third embodiment, furnishing the band 230 for attachment to the substrate 207 and the chassis 205 in the aforedescribed manner allows the semiconductor elements 6a and 6b to be easily induced into contact with the contact parts 11a and 12a by the band 230. Moreover, employing the band 230, allows the liquid crystal display device to be more compact and lighter in weight as compared with the aforedescribed first embodiment.

Other advantageous effects of the third embodiment are analogous to those of the aforedescribed first and second embodiments.

Fourth Embodiment

In this fourth embodiment, there is described with reference to FIGS. 12 and 13 a case that differs from the aforedescribed first to third embodiments in that an adhesive layer 330 is employed to induce the semiconductor elements 6 into contact with a chassis 305.

Figure 12:
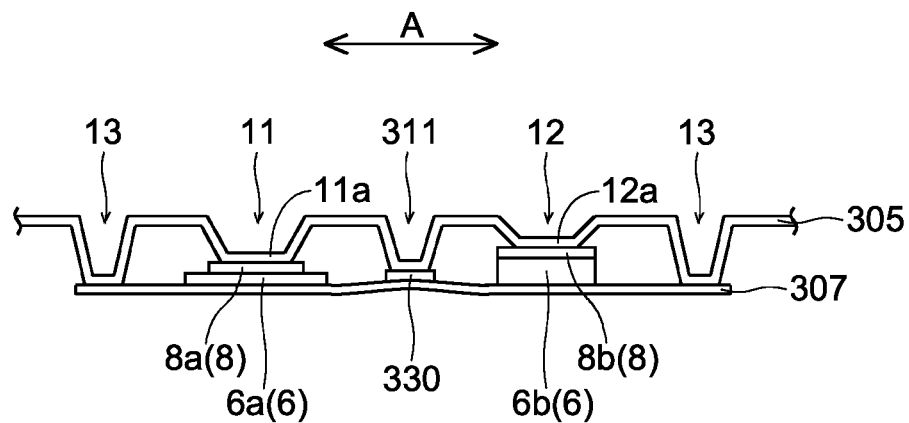
FIG. 12 is a cross-sectional view showing the structure in the vicinity of the substrate of a liquid crystal display device according to a fourth embodiment of the present invention.
Figure 13:
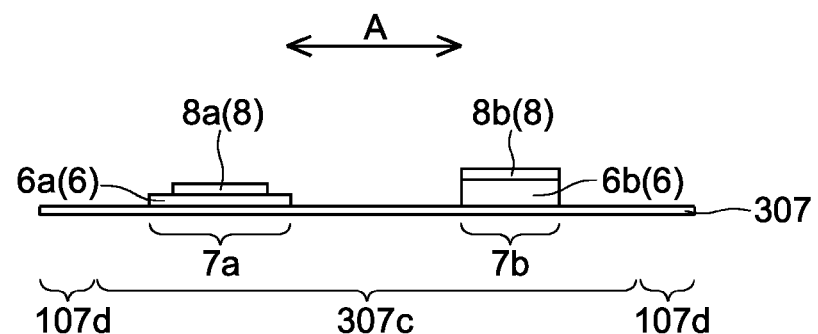
FIG. 13 is a cross-sectional view showing the structure of the substrate shown in FIG. 12.

In the fourth embodiment, a rib 311 that protrudes towards the substrate 307 side (the outside) is formed on the chassis 305 between the rib 11 and the rib 12, as shown in FIG. 12. This rib 311 has a protruding height that is less than that of the plurality of ribs 13. The chassis 305 is an example of the "metal plate" of the present invention.

The adhesive layer 330 is disposed between the rib 311 and the substrate 307, and a center part 307c of the substrate 307 (the section between the element-mounting parts 7a and 7b) (see FIG. 13) is bowed towards the chassis 305 side by the adhesive layer 330. Because of this, the semiconductor elements 6 are depressed against the ribs 11 and 12 of the chassis. The adhesive layer 330 is an example of the "contact-inducing member" and the "first adhesive layer" of the present invention.

In the fourth embodiment, bowing of the substrate 307 can be retained in a state in which the center part 307c of the substrate 307 has been bowed towards the chassis 305 side by curing the adhesive layer 330.

Other structures of the fourth embodiment are analogous to those of the aforedescribed first to third embodiments.

In the fourth embodiment, furnishing the adhesive layer 330 for adhering the substrate 307 and the chassis 305 in the aforedescribed manner, allows the semiconductor elements 6a and 6b to be easily induced into contact with the contact parts 11a and 12a by the adhesive layer 330.

Other advantageous effects of the third embodiment are analogous to those of the aforedescribed first to third embodiments.

Fifth Embodiment

In this fifth embodiment, there is described with reference to FIGS. 14 to 17 a case that differs from the aforedescribed first to fourth embodiments in that spring parts 411b and 412b are furnished in order to induce the semiconductor elements 6 into contact with contact parts 411a and 412a.

Figure 14:
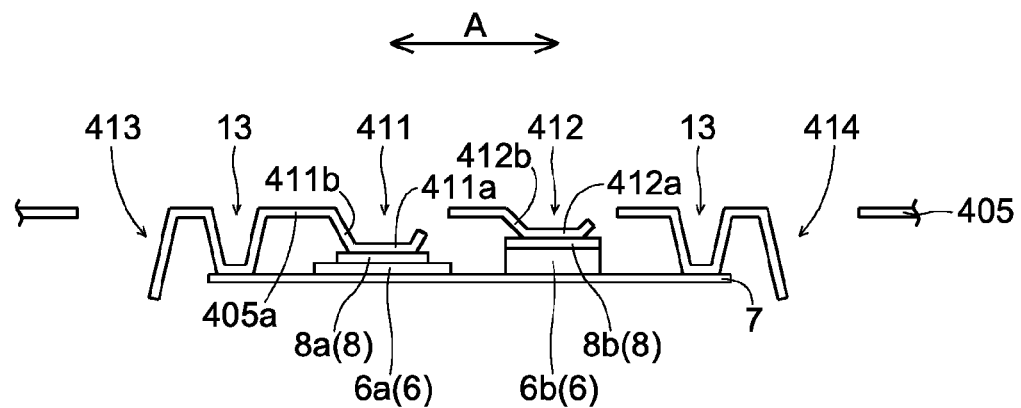
FIG. 14 is a cross-sectional view showing the structure in the vicinity of the substrate of a liquid crystal display device according to a fifth embodiment of the present invention.

In the fifth embodiment, a plurality of protruding parts 411 and 412 that protrude towards the substrate 7 side (the outside), a plurality of ribs 13, and a plurality of fin parts 413 and 414 that function as heat-dissipating fins, are formed on a chassis 405, as shown in FIG. 14. The chassis 405 is an example of the "metal plate" of the present invention, and the protruding parts 411 and 412 are examples of the "first protruding part" and the "heat-dissipating fin" of the present invention. The fin parts 413 and 414 are examples of the "heat-dissipating fin" of the present invention.

The plurality of protruding parts 411 and 412 contact the semiconductor elements 6 via the heat-transmitting members 8. The plurality of protruding parts 411 and 412 are formed so as to have mutually different protruding heights; for example, the protruding part 412 has less protruding height than the protruding part 411.

The protruding part 411 is formed at a position in opposition to the semiconductor element 6a, and the protruding part 412 is formed at a position in opposition to the semiconductor element 6b.

In the fifth embodiment, the protruding part 411 includes a contact part 411a for contacting the semiconductor element 6 (the heat-transmitting member 8), and a spring part 411b for urging the contact part 411a towards the semiconductor element 6 side. This spring part 411b connects the contact part 411a and a flat face part 405a of the chassis 405 (the section of the chassis 405 that is not the protruding parts 411, 412, the ribs 13, or the fin parts 413 and 414).

In the same way, the protruding part 412 includes a contact part 412a for contacting the semiconductor element 6 (the heat-transmitting member 8), and a spring part 412b for urging the contact part 412a towards the semiconductor element 6 side. This spring part 412b connects the contact part 412a and the flat face part 405a of the chassis 405.

Figure 15:
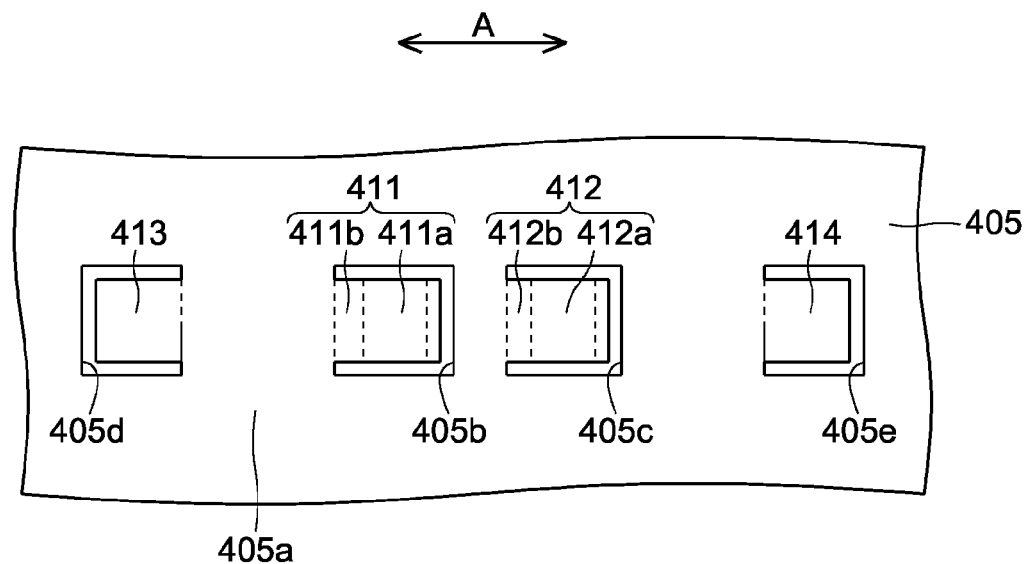
FIG. 15 is a plan view describing the structure of the chassis shown in FIG. 14.

The protruding parts 411 and 412 are formed by cutting out and bending portions of the chassis 405. Specifically, cutout parts 405b and 405c having, for example, a "C" shape are respectively formed at the peripheries of the protruding parts 411 and 412, as shown in FIG. 15. The protruding parts 411 and 412 are then formed by bending at the positions of the broken lines in FIG. 15.

Figure 16:
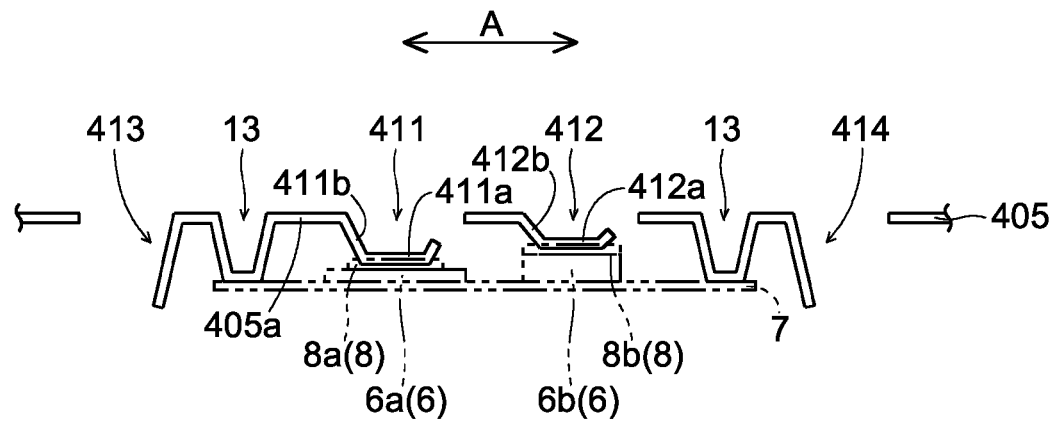
FIG. 16 is a cross-sectional view describing the structure of the chassis shown in FIG. 14.

Moreover, in the fifth embodiment, the contact part 411a of the protruding part 411 is formed in such a way that the part is positioned to the outside (the bottom side) of the position at which the top face (front face) of the heat-transmitting member 8 is planned to be disposed in a state in which the substrate 7 is not yet fixed to the chassis 405, as shown in FIG. 16. By so doing, it is possible for the contact part 411a to be reliably induced into contact with the heat-transmitting member 8 (the semiconductor element 6) in a state in which the substrate 7 has been fixed to the chassis 405 (the state of FIG. 14).

Moreover, in a state in which the substrate 7 has been fixed to the chassis 405, the spring part 411b of the protruding part 411 elastically deforms, and it is therefore possible to suppress instances of excessively great contact pressure of the contact part 411a against the heat-transmitting member 8 (the semiconductor element 6).

In the same way, the contact part 412a of the protruding part 412 is formed in such a way that, in a state in which the substrate 7 is not yet fixed to the chassis 405, the part is positioned to the outside (the bottom side) of the position at which the top face (front face) of the heat-transmitting member 8 is planned to be disposed. By so doing, it is possible for the contact part 412a to be reliably induced into contact with the heat-transmitting member 8 (the semiconductor element 6) in a state in which the substrate 7 has been fixed to the chassis 405.

Moreover, in a state in which the substrate 7 has been fixed to the chassis 405, the spring part 412b of the protruding part 412 elastically deforms, and it is therefore possible to suppress instances of excessively great contact pressure of the contact part 412a against the heat-transmitting member 8 (the semiconductor element 6).

Figure 17:
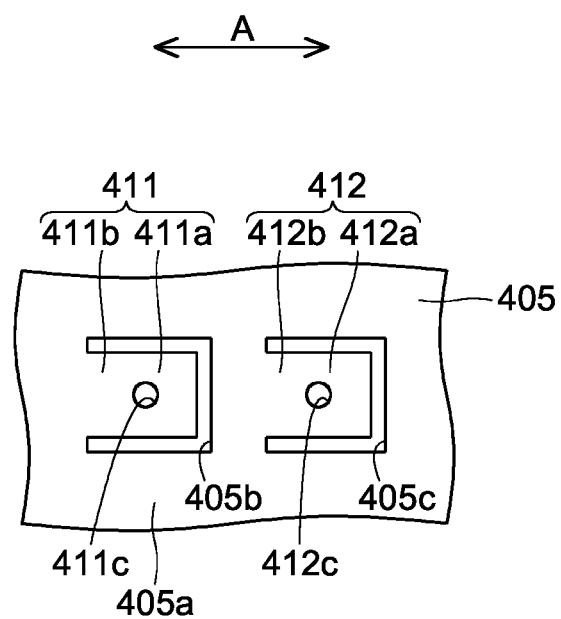
FIG. 17 is a plan view describing the structure of the chassis shown in FIG. 14.

As shown in FIG. 17, through-holes 411c and 412c may be respectively formed in the contact parts 411a and 411b.

The plurality of fin parts 413 and 414 are formed by cutting out and bending portions of the chassis 405. Specifically, cutout parts 405d and 405e having, for example, a "C" shape are respectively formed at the peripheries of the fin parts 413 and 414, as shown in FIG. 15. The fin parts 413 and 414 are then formed by bending at the positions of the double-dot dashed lines in FIG. 15.

By bending the fin parts 413 and 414, the gaps between the fin parts 413 and 414 and the flat face part 405a of the chassis 405 become larger, and therefore passage of air (flow of air) improves. It is possible to improve the heat-dissipating properties by furnishing the fin parts 413 and 414 in sections of good air passage.

In the fifth embodiment, gaps are formed at the peripheries of the protruding parts 411 and 412, and the protruding parts 411 and 412 also function as heat-dissipating fins.

In a case in which it is desired to further improve the heat-dissipating properties, a separate heat-dissipating fin (not illustrated) may be furnished. In this case, the heat-dissipating fin is preferably disposed in such a way that the airflow collides directly against the protruding parts 411 and 412, or the fin parts 413 and 414.

Other structures of the fifth embodiment are analogous to those of the aforedescribed first to fourth embodiments.

In the fifth embodiment, the spring parts 411b and 412b for urging the contact parts 411a and 412a towards the semiconductor element 6 (6a and 6b) side are formed on the chassis 405 in the aforedescribed manner, whereby the semiconductor elements 6a and 6b can easily be induced into contact with the contact parts 411a and 412a.

Moreover, in the fifth embodiment, the protruding parts 411 and 412 are formed by bending the chassis 405 in the aforedescribed manner. By so doing, sections that protrude towards the semiconductor element 6 (6a and 6b) side (the protruding parts 411 and 412) can be easily formed on the chassis 405, and the spring parts 411b and 412b for urging the contact parts 411a and 412a towards the semiconductor element 6 (6a and 6b) side can be easily formed on the protruding parts 411 and 412.

Moreover, by forming the cutout parts 405b and 405c in the chassis 405, the protruding parts 411 and 412 can be formed at any position on the chassis 405.

Moreover, in the fifth embodiment, the heat-dissipating properties of the liquid crystal display device can be further improved by furnishing the chassis 405 with the fin parts 413 and 414 in the aforedescribed manner.

Further, in the fifth embodiment, the heat-dissipating properties of the liquid crystal display device can be further improved because the protruding parts 411 and 412 function as heat-dissipating fins.

Moreover, in the fifth embodiment, the fin parts 413 and 414 can be easily formed on the chassis 405 by furnishing the chassis 405 with the cutout parts 405d and 405e in the aforedescribed manner.

Moreover, in the fifth embodiment, the through-holes 411c and 412c are formed in the contact parts 411a and 412a in the aforedescribed manner, whereby it can be verified from the chassis 405 side whether the heat-transmitting members 8 (8a and 8b) are disposed over the semiconductor elements 6 (6a and 6b) when attaching the substrate 7 to the chassis 405.

Other advantageous effects of the fifth embodiment are analogous to those of the aforedescribed first to fourth embodiments.

Sixth Embodiment

In this sixth embodiment, there is described with reference to FIGS. 18 and 19 a case that differs from the aforedescribed fifth embodiment in that plate springs 540 and 541 are furnished to a chassis 505.

Figure 18:
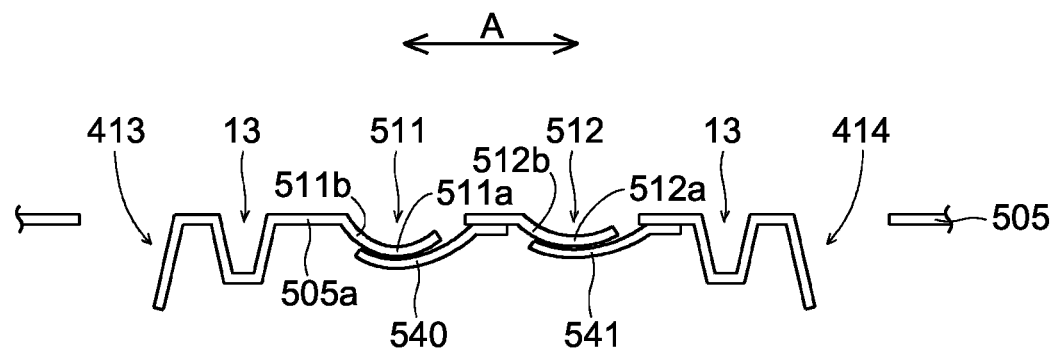
FIG. 18 is a cross-sectional view showing the structure in the vicinity of the chassis of a liquid crystal display device according to a sixth embodiment of the present invention.

In the sixth embodiment, a plurality of protruding parts 511 and 512 that protrude towards the substrate 7 side (the outside), a plurality of ribs 13, and a plurality of fin parts 413 and 414 are formed on the chassis 505, as shown in FIG. 18. The chassis 505 is an example of the "metal plate" of the present invention, and the protruding parts 511 and 512 are examples of the "first protruding part" and the "heat-dissipating fin" of the present invention.

The plurality of protruding parts 511 and 512 are formed so as to have mutually different protruding heights; for example, the protruding part 512 has less protruding height than the protruding part 511.

The protruding part 511 is formed at a position in opposition to the semiconductor element 6a, and the protruding part 512 is formed at a position in opposition to the semiconductor element 6b.

The protruding part 511 includes a contact part 511a, and a spring part 511b for urging the contact part 511a towards the semiconductor element 6 side. In the same way, the protruding part 512 includes a contact part 512a, and a spring part 512b for urging the contact part 512a towards the semiconductor element 6 side.

Figure 19:
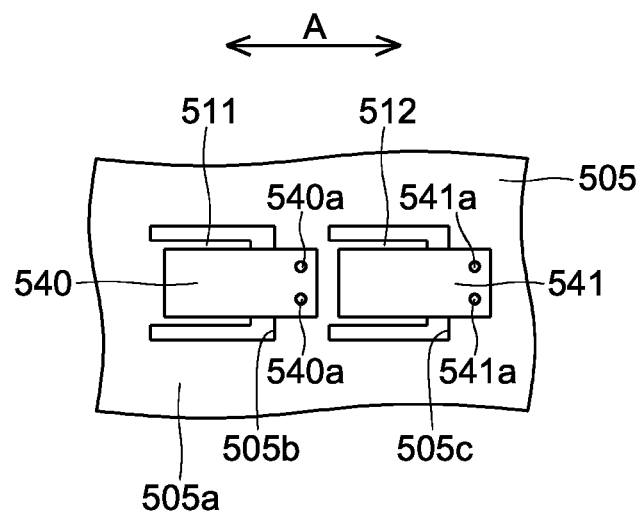
FIG. 19 is a bottom view describing the structure in the vicinity of the chassis shown in FIG. 18.

As shown in FIG. 19, cutout parts 505b and 505c having a "C" shape are respectively formed at the peripheries of the protruding parts 511 and 512, and the protruding parts 511 and 512 are formed by bending portions of the chassis 505. The cutout parts 505b and 505c are an example of the "cutout parts" of the present invention.

In the sixth embodiment, the plate springs 540 and 541, which are formed of, for example, copper, aluminum, or the like, are attached to predetermined regions of the chassis 505. The plate springs 540 and 541 are an example of the "first heat-transmitting members" of the present invention.

Specifically, the plate spring 540 is disposed so as to span the cutout part 505b. The plate spring 540 is bowed, and is formed so as to wedge between the protruding part 511 and the heat-transmitting members 8 (the semiconductor elements 6).

The plate spring 540 is fixed to a flat face part 505a of the chassis 505 (the section of the chassis 505 that is not the protruding parts 511, 512, the ribs 13, or the fin parts 413 and 414) by, for example, spot welding of a welding part 540a. The plate spring 540 then contacts the protruding part 511 and the flat face part 505a of the chassis 505. The flat face part 505a is an example of the "section of the metal plate other than the first protruding part" of the present invention.

In the same way, the plate spring 541 is disposed so as to span the cutout part 505c. The plate spring 541 is bowed, and is formed so as to wedge between the protruding part 512 and the heat-transmitting members 8 (the semiconductor element 6s).

The plate spring 541 is fixed to the flat face part 505a of the chassis 505 by, for example, spot welding of a welding part 541a. The plate spring 541 then contacts the protruding part 512 and the flat face part 505a of the chassis 505.

In a state in which the substrate 7 has not yet been fixed to the chassis 505, the plate springs 540 and 541 are formed so as to be positioned to the outside (the bottom side) of the planned position at which the top face (front face) of the heat-transmitting members 8 is to be disposed. By so doing, in a state in which the substrate 7 has been fixed to the chassis 505, it is possible for the contact part 511a to be reliably induced into contact with the heat-transmitting members 8 (the semiconductor elements 6) via the plate spring 540, and for the contact part 512a to be reliably induced into contact with the heat-transmitting members 8 (the semiconductor elements 6) via the plate spring 541.

In the drawings, the plate springs 540 and 541 are formed in a rectangular shape when seen in plan view, but may instead be formed in a triangular shape, circular shape, polygonal shape, or the like.

The protruding part 511 may be disposed so as to wedge between the plate spring 540 and the heat-transmitting members 8 (the semiconductor elements 6). In the same way, the protruding part 512 may be disposed so as to wedge between the plate spring 541 and the heat conducting members 8 (the semiconductor elements 6).

Other structures of the sixth embodiment are analogous to those of the aforedescribed first to fifth embodiments.

In the sixth embodiment, there is furnished the plate spring 540 that spans the cutout part 505b and contacts the protruding part 511 and the flat face part 505a, as in the aforedescribed manner. In a case in which the cutout part 505b has been formed at the periphery of the protruding part 511, heat generated by the semiconductor element 6a is transmitted (dissipated) in directions other than that in which the cutout portion 505b has been formed; however, by furnishing the plate spring 540 in the aforedescribed manner, heat generated by the semiconductor element 6a can be transmitted (dissipated) in directions other than that in which the cutout portion 505b has been formed, and in the direction in which the cutout portion 505b has been formed (the direction in which the plate spring 540 is furnished). By so doing, the heat-dissipating properties of the liquid crystal display device can be improved.

In the same way, there is furnished the plate spring 541 that spans the cutout part 505c and contacts the protruding part 512 and the flat face part 505a. In a case in which the cutout part 505c has been formed at the periphery of the protruding part 512, heat generated by the semiconductor element 6b is transmitted (dissipated) in directions other than that in which the cutout portion 505c has been formed; however, by furnishing the plate spring 541 in the aforedescribed manner, heat generated by the semiconductor element 6b can be transmitted (dissipated) in directions other than that in which the cutout portion 505c has been formed, and in the direction in which the cutout portion 505c has been formed (the direction in which the plate spring 541 is furnished). By so doing, the heat-dissipating properties of the liquid crystal display device can be improved.

Other advantageous effects of the sixth embodiment are analogous to those of the aforedescribed first to fifth embodiments.

Seventh Embodiment

In this seventh embodiment, there is described with reference to FIGS. 20 and 21 a case that differs from the aforedescribed first to sixth embodiments in that elastic bodies 650 are furnished between a chassis 605 and the substrate 7.

Figure 20:
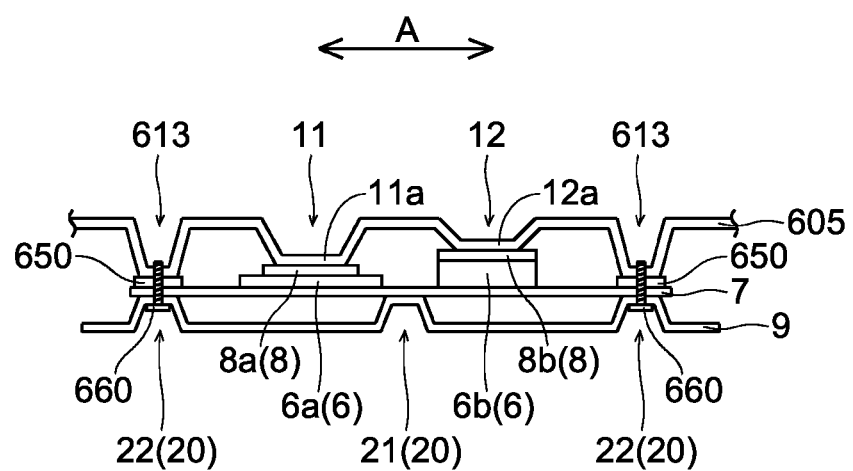
FIG. 20 is a cross-sectional view showing the structure in the vicinity of the substrate of a liquid crystal display device according to a seventh embodiment of the present invention.

In the seventh embodiment, the chassis 605 includes ribs 11 and 12 that protrude towards the substrate 7 side (the outside), and a plurality of ribs 613 disposed on the chassis 605 at positions corresponding to the edge parts 7d of the substrate 7 (see FIG. 21), as shown in FIG. 20. The chassis 605 is an example of the "metal plate" of the present invention, and the ribs 613 are an example of the "third protruding parts" of the present invention.

In the seventh embodiment, the elastic bodies 650 for adjusting the distance from the chassis 605 (the ribs 613, 11, and 12) to the substrate 7 are disposed between the ribs 613 and the substrate 7. The elastic bodies 650 are formed, for example, from silicone rubber, nylon orurethane rubber, or the like, and are elastically deformable. The elastic bodies 650 are an example of the "first elastic bodies" of the present invention.

Figure 21:
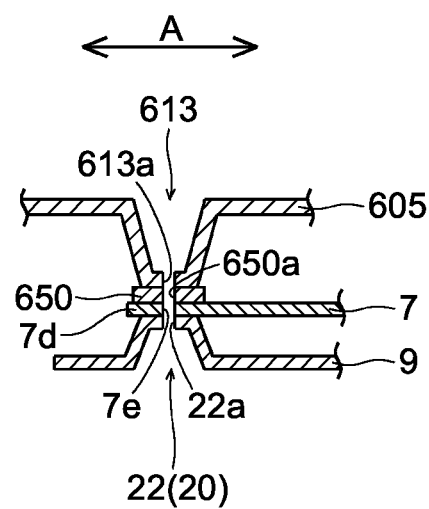
FIG. 21 is an enlarged cross-sectional view describing the structure in the vicinity of the substrate shown in FIG. 20.

As shown in FIG. 21, a screw hole 613a is formed in the rib 613. A screw thread is formed in this screw hole 613a.

Screw holes 650a, 7e, and 22a are respectively formed in the elastic body 650, the substrate 7, and the rib 22 of the pressing member 9 at positions corresponding to the screw hole 613a of the chassis 605.

As shown in FIG. 20, a screw 660 is attached in the screw holes 613a, 650a, 7e, and 22a (see FIG. 21), and the pressing member 9 and the substrate 7, together with the elastic body 650, are fixed to the chassis 605 by the screw 660.

At this time, the elastic body 650 is deformed (compressed) to a predetermined thickness through tightening of the screw 660.

Other structures of the seventh embodiment are analogous to those of the aforedescribed first to sixth embodiments.

In the seventh embodiment, the elastic bodies 650 for adjusting the distance from the chassis 605 to the substrate 7 are furnished between the ribs 613 and the substrate 7 in the aforedescribed manner. By so doing, the distance from the contact parts 11a and 12a (the ribs 11 and 12) to the substrate 7 can be adjusted, and the contact pressure between the semiconductor elements 6 (6a and 6b) and the contact parts 11a and 12a can therefore be adjusted.

Other advantageous effects of the seventh embodiment are analogous to those of the aforedescribed first to sixth embodiments.

Eighth Embodiment

In this eighth embodiment, there is described with reference to FIGS. 22 and 23 a case that differs from the aforedescribed seventh embodiment in that a chassis 705 is furnished with protruding members 711 and 712 via elastic bodies 750 and 751.

Figure 22:
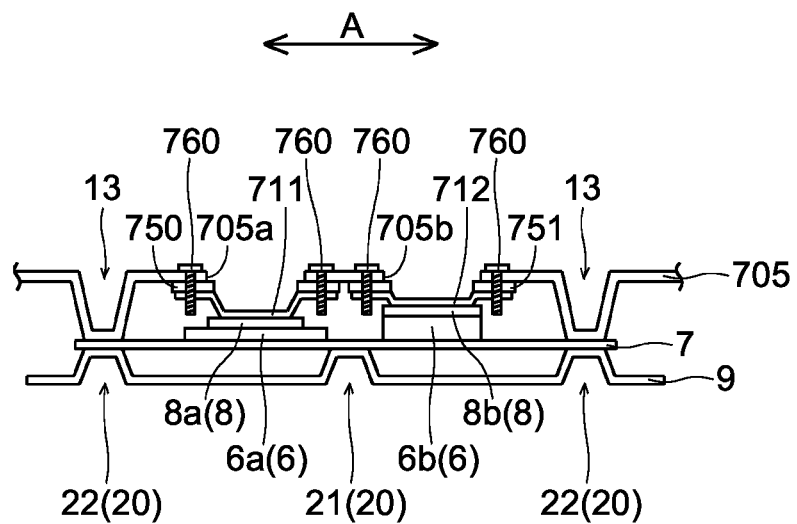
FIG. 22 is a cross-sectional view showing the structure in the vicinity of the chassis of a liquid crystal display device according to an eighth embodiment of the present invention.

In the eighth embodiment, the chassis 705 includes a plurality of ribs 13, and opening parts 705a and 705b that are formed in the vicinity of sections in which the plurality of protruding members 711 and 712 are attached, as shown in FIG. 22. The chassis 705 is an example of the "metal plate" of the present invention, and the protruding members 711 and 712 are an example of the "first protruding parts" of the present invention.

Figure 23:
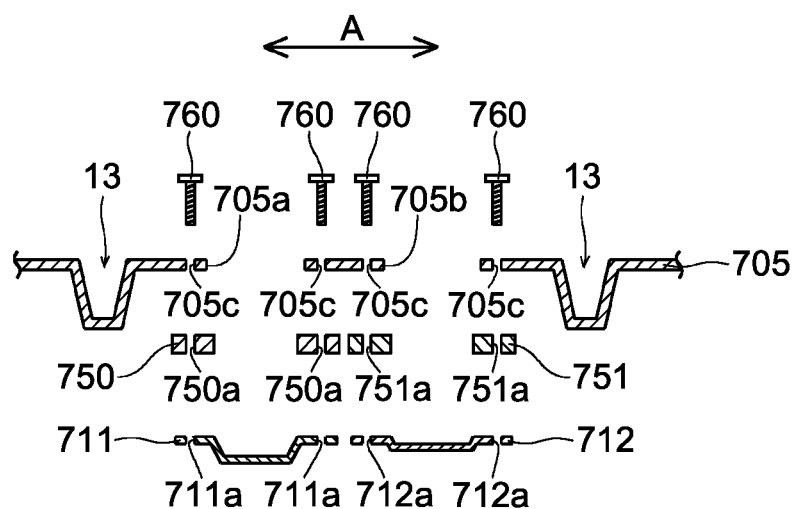
FIG. 23 is a cross-sectional view describing the structure in the vicinity of the chassis shown in FIG. 22.

As shown in FIG. 23, a plurality of screw holes 705c is formed in the vicinity of the opening parts 705a and 705b of the chassis 705.

In the eighth embodiment, the protruding members 711 and 712 that protrude towards the substrate 7 side are respectively attached to the chassis 705 in such a way as to block the opening parts 705a and 705b, as shown in FIG. 22.

The elastic body 750 for adjusting the distance from the protruding member 711 to the chassis 705 is disposed between the protruding member 711 and the chassis 705. The elastic body 751 for adjusting the distance from the protruding member 712 to the chassis 705 is disposed between the protruding member 712 and the chassis 705. The elastic bodies 750 and 751 are formed, for example, from silicone rubber, nylon, urethane rubber, or the like, and are elastically deformable. The elastic bodies 750 and 751 are an example of the "second elastic bodies" of the present invention.

As shown in FIG. 23, screw holes 750a, 751a, 711a, and 712a are respectively formed in the elastic bodies 750 and 751 and in the protruding members 711 and 712 at positions corresponding to the screw holes 705c of the chassis 705. Screw threads are formed in the screw holes 711a and 712a.

As shown in FIG. 22, screws 760 are attached to the screw holes 705c, 750a, 751a, 711a, and 712a (see FIG. 23), and the protruding members 711 and 712, together with the respective elastic bodies 750 and 751, are fixed to the chassis 705 by the screws 760.

At this time, the elastic bodies 750 and 751 are deformed (compressed) to a predetermined thickness through tightening of the screws 760.

In FIG. 22 and FIG. 23, the protruding members 711 and 712 are formed to a smaller thickness than the chassis 705, but the protruding members 711 and 712 may be formed to the same thickness as the chassis 705, or to a greater thickness than the chassis 705.

Opening parts 705a and 705b may be omitted from formation in the chassis 705 as well.

Other structures of the eighth embodiment are analogous to those of the aforedescribed first to seventh embodiments.

In the eighth embodiment, the protruding members 711 and 712 are respectively attached to the chassis 705 via the elastic bodies 750 and 751 in the aforedescribed manner. By so doing, the distance from the protruding members 711 and 712 to the chassis 5 can be adjusted, and therefore the distance from the protruding members 711 and 712 to the substrate 7 can be adjusted. By so doing, the contact pressure between the semiconductor elements 6 (6a and 6b) and the protruding members 711 and 712 can be adjusted.

Other advantageous effects of the eighth embodiment are analogous to those of the aforedescribed first to seventh embodiments.

The embodiments disclosed herein are in all respects merely exemplary, and should not be construed as limiting. The scope of the invention is shown by the scope of claims, and not by the preceding description of the embodiments, and further includes all modifications equivalent in meaning to and falling within the scope of the claims.

For example, whereas examples of implementation of the display device in a liquid crystal display device were shown in the aforedescribed embodiments, the present invention is not limited thereto, and may be implemented in a display device other than a liquid crystal display device.

Moreover, whereas examples of implementation of the electronic device in a display device were shown in the aforedescribed embodiments, the present invention is not limited thereto, and is implementable in various other electronic devices, such as mobile devices, household electrical appliances, solar cells, and the like.

Moreover, in the aforedescribed embodiments, there were shown examples in which the liquid crystal display device is formed by a direct-type backlight device, but the present invention is not limited to this, and the liquid crystal display device could instead be formed by a side-light backlight device.

Moreover, in the aforedescribed embodiments, there were shown examples in which pressing members, screws, bands, or adhesive layers are employed to induce the semiconductor elements into contact with the chassis, but the present invention is not limited to this, and pressing members, screws, bands, or adhesive layers may be employed in combinations of two or more in order to induce the semiconductor elements into contact with the chassis. Alternatively, concomitantly with employing at least one of these, the chassis may be furnished with spring parts.

Moreover, in the aforedescribed embodiments, it was described as being possible to induce the semiconductor elements into contact with the chassis even in cases in which the protruding height of first protruding parts (ribs, protruding parts) of the chassis is greater or less due to production variations; however, the present invention is not limited to this, and it is possible to induce the semiconductor elements into contact with the chassis even in cases in which the thickness of the semiconductor elements, the thickness of the heat-transmitting members, or the attachment height of the semiconductor elements is greater or less due to production variations.

Moreover, in the aforedescribed embodiments, there were shown examples in which the heat-transmitting members are formed by a heat-dissipating sheet (heat-conducting sheet) having high heat conductivity, but the present invention is not limited to this, and the heat-transmitting members may instead be formed from heat-dissipating grease (for example, silicone grease) having high heat conductivity, or the like.

Moreover, in the aforedescribed embodiments, there were shown examples in which the pressing member or substrate is fixed to the chassis with screws or the like, but the present invention is not limited to this, and the pressing member or substrate may be fixed to the chassis with fixing members other than screws.

Moreover, in the aforedescribed fifth embodiment, there was shown an example of forming a through-hole in the contact parts, but the present invention is not limited to this, and a through-hole may be formed in the contact parts in another embodiment.

Moreover, in the aforedescribed second to fourth embodiments, there were shown examples in which the semiconductor elements are induced into contact with the chassis by screws, bands, or an adhesive layer, but the present invention is not limited to this, and the semiconductor elements may be induced into contact with the chassis by employing sticky tape to pull the substrate (the semiconductor elements) towards the chassis side, or by utilizing the attractive force or repulsive force of a magnet or the like to depress the substrate (the semiconductor elements) towards the chassis side.

Moreover, in the aforedescribed first embodiment, for example, there was shown an example of furnishing a pressing member in order to depress the substrate towards the chassis side, but the present invention is not limited to this, and the substrate may instead be depressed towards the chassis side by, for example, the frame of the television receiver (the frame that houses the electronic device) or the like. In this case, there is no need to separately furnish a pressing member, therefore making it possible to reduce the number of components.

Moreover, in the aforedescribed embodiments, there were shown examples in which a flat part is formed on the contact parts, but the present invention is not limited to this, and the contact parts may instead be formed to a spherical shape, peak shape (wave shape), or the like. According to this constitution, it is possible to adjust the contact pressure between the contact parts and the semiconductor elements.

Figure 24:
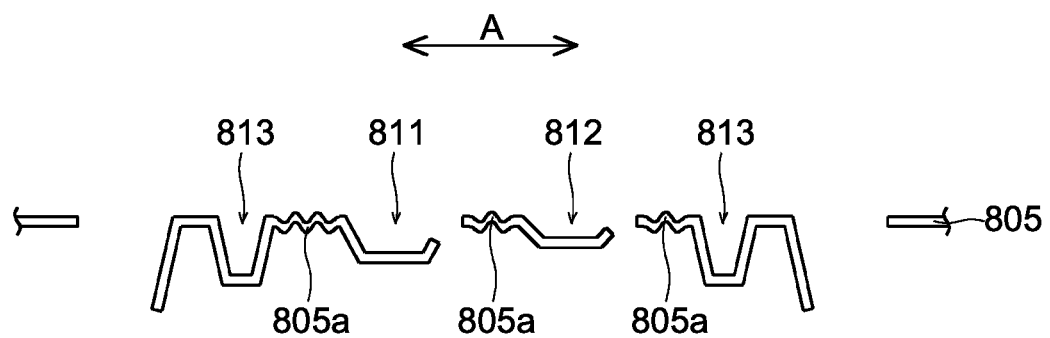
FIG. 24 is a cross-sectional view showing the structure of the chassis of a liquid crystal display device according to a first modification example of the present invention.

Moreover, in the aforedescribed embodiments, there were shown examples in which sections of the chassis other than the protruding parts and the ribs are formed by flat face parts, but the present invention is not limited to this. As in a chassis (metal plate) 805 according to a first modification example of the present invention shown in FIG. 24, ribs 805*a* having, for example, a wave shape may be formed in sections of the chassis 805 other than protruding parts (a first protruding part and a heat-dissipating fin) 811, 812 and ribs (third protruding parts) 813. According to this constitution, heat-dissipating properties can be further improved. In this case, the ribs 805*a* are preferably formed in sections at the periphery of the protruding parts 811 and 812 of the chassis 805.

Figure 25:
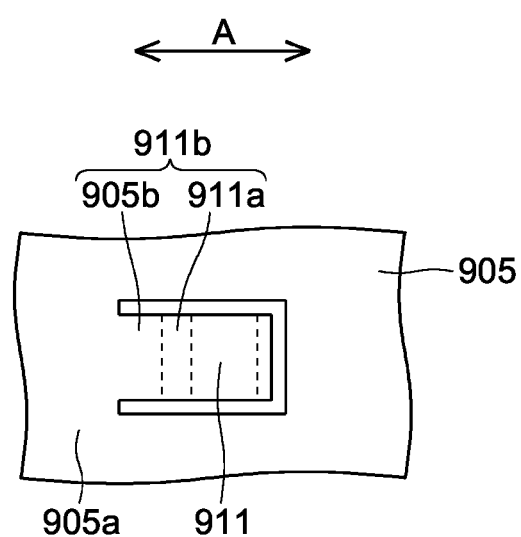
FIG. 25 is a plan view describing the structure of the chassis of a liquid crystal display device according to a second modification example of the present invention.

Moreover, in the aforedescribed fifth embodiment, for example, there was shown an example in which the protruding part is furnished with a spring part, but the present invention is not limited to this. As in a chassis (metal plate) 905 according to a second modification example of the present invention shown in FIG. 25, for example, a spring part 911*b* may be formed by a part 911*a* of a protruding part (a first protruding part or a heat-dissipating fin) 911 and a part 905*b* of a flat face part 905*a*.

Moreover, in the aforedescribed fifth embodiment, for example, there was shown an example in which a protruding part that includes a contact part and a spring part is formed by the chassis, but the present invention is not limited to this, and a protruding member that includes a contact part and a spring part may be attached to the chassis instead.

Figure 26:
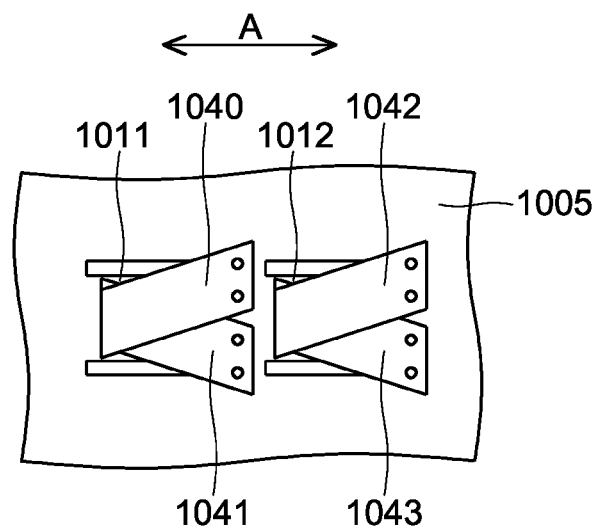
FIG. 26 is a bottom view showing the structure in the vicinity of the chassis of a liquid crystal display device according to a third modification example of the present invention.

Moreover, in the aforedescribed sixth embodiment, there was shown an example in which a single plate spring is attached to a single protruding part, but the present invention is not limited to this, and two or more plate springs may be attached to a single protruding part. As in a third modification example of the present invention shown in FIG. 26, for example, plate springs (first heat-transmitting members) 1040 and 1041 may be attached to a protruding part (first protruding part or heat-dissipating fin) 1011 of a chassis (metal plate) 1005, and plate springs (first heat-transmitting members) 1042 and 1043 may be attached to a protruding part (first protruding part or heat-dissipating fin) 1012. In this case, the heat generated by the semiconductor elements can be dissipated (transmitted) in three directions, and therefore the heat-dissipating properties can be improved further.

Figure 27:
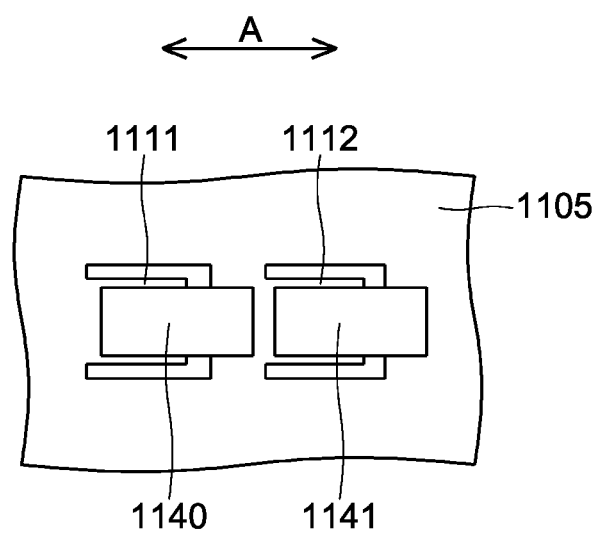
FIG. 27 is a bottom view showing the structure in the vicinity of the chassis of a liquid crystal display device according to a fourth modification example of the present invention.

Moreover, in the aforedescribed sixth embodiment, there was shown an example in which a plate spring is attached to a protruding part, but the present invention is not limited to this, and a heat-transmitting member other than a plate spring may be attached instead. As in a fourth modification example of the present invention shown in FIG. 27, for example, metal tape (first heat-transmitting members) 1140 and 1141, such as copper tape or the like, may be respectively attached to protruding parts (a first protruding part or heat-dissipating fin) 1111 and 1112 of a chassis (metal plate) 1105.

Figure 28:
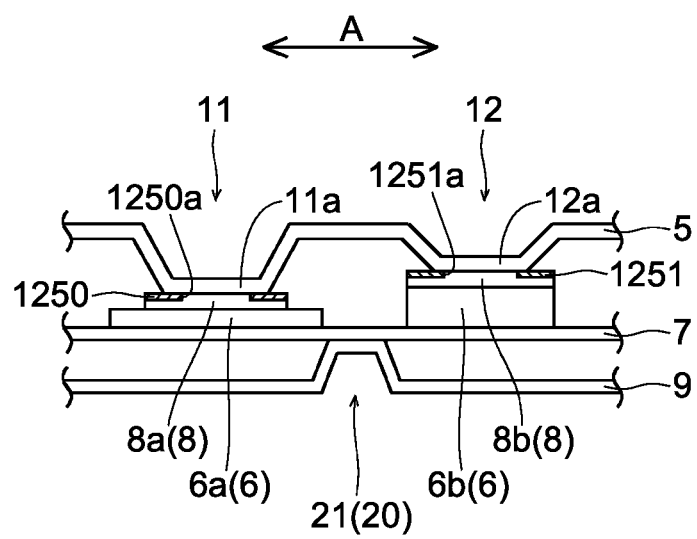
FIG. 28 is a cross-sectional view showing the structure in the vicinity of heat-transmitting members of a liquid crystal display device according to a fifth modification example of the present invention.
Figure 29:
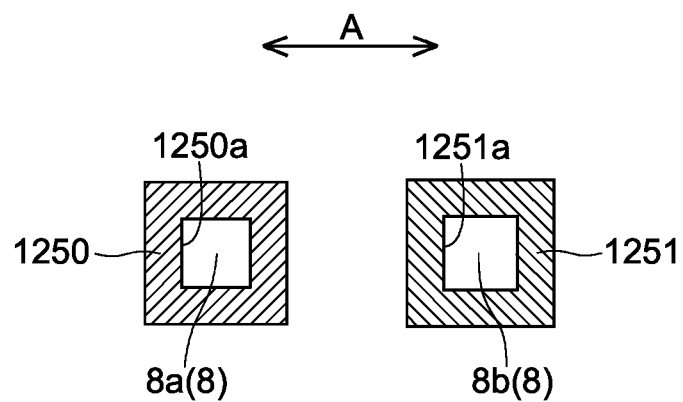
FIG. 29 is a plan view showing the structure of the heat-transmitting members and the adhesive layers shown in FIG. 28.

Moreover, in the aforedescribed embodiments, there were shown examples in which the second heat-transmitting members are disposed between the semiconductor elements and the first protruding parts (ribs, protruding parts), but the present invention is not limited to this, and the second heat-transmitting members, together with adhesive layers, could be disposed between the semiconductor elements and the first protruding parts (ribs, protruding parts). For example, as in the fifth modification example of the present invention shown in FIG. 28 and FIG. 29, adhesive layers (second adhesive layers) 1250 and 1251 may be disposed between the heat-transmitting members 8 (8*a* and 8*b*) and the ribs 11 and 12. According to this constitution, good contact can be maintained between the heat-transmitting members 8 (8*a* and 8*b*) and the ribs 11 and 12, and therefore heat generated by the semiconductor elements 6 (6*a* and 6*b*) can be more easily transmitted (dissipated) to the ribs 11 and 12. By so doing, the heat-dissipating properties of the liquid crystal display device can be further improved. As shown in FIG. 29, opening parts 1250*a* and 1251*a* may be respectively formed in the center part of the adhesive layers 1250 and 1251, so that the adhesive layers 1250 and 1251 are disposed only in sections in the vicinity of the heat-transmitting members 8 (8*a* and 8*b*). Alternatively, the opening parts 1250*a* and 1251*a* may not be formed in the center part of the adhesive layers 1250 and 1251, and the adhesive layers 1250 and 1251 may be disposed over the entire face of the heat-transmitting members 8 (8a and 8b). The adhesive layers 1250 and 1251 can be easily formed, for example, by applying an adhesive or sticking double-sided tape to the heat-transmitting members 8 (8a and 8b).

Figure 30:
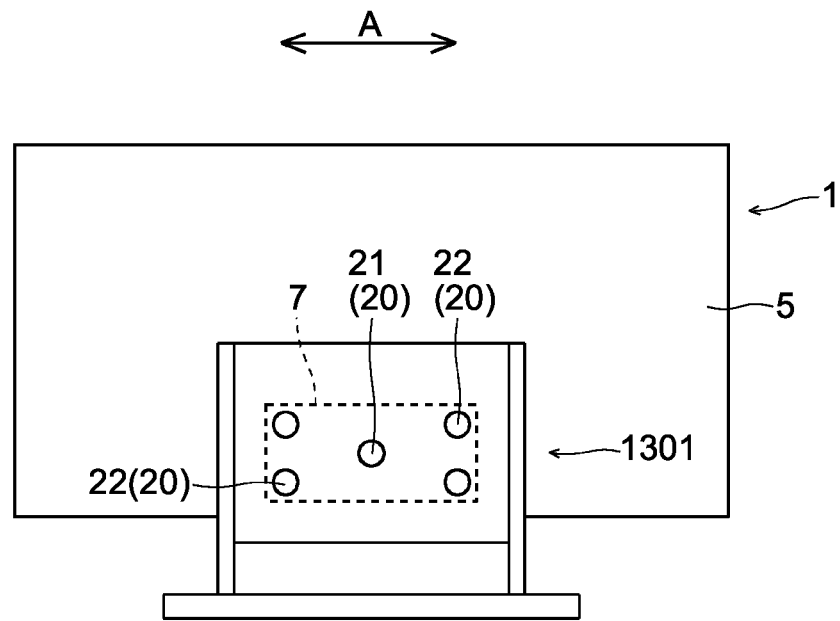
FIG. 30 is a back view showing the structure of a television receiver according to a sixth modification example of the present invention.
Figure 31:
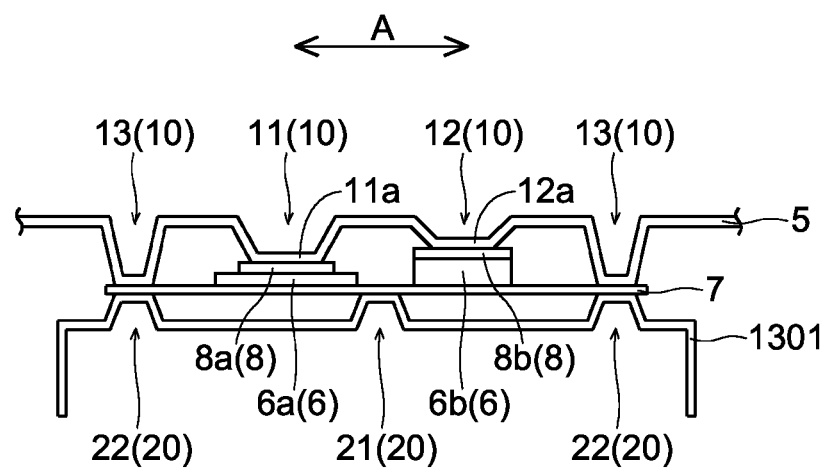
FIG. 31 is a cross-sectional view showing the structure in the vicinity of the substrate of FIG. 30, from the top side.

Moreover, in the aforedescribed first embodiment, for example, there was shown an example in which the liquid crystal display device 1 is furnished with the pressing member 9, but the present invention is not limited to this. For example, as in the television receiver according to a sixth modification example shown in FIG. 30, a pressing member may be furnished separately from the liquid crystal display device 1. Specifically, the television receiver is constituted by the liquid crystal display device 1, and a support member 1301 made of, for example, sheet metal for supporting the liquid crystal display device 1. Then, ribs 21 and 22 are formed in the support member 1301 in a manner analogous to the pressing member 9, as shown in FIG. 30 and FIG. 31. Specifically, the support member 1301 serves concomitantly as a pressing member (contact-inducing member). According to this constitution, the increase in the number of components can be suppressed. Moreover, heat generated by the semiconductor elements 6a and 6b can be dissipated from the support member 1301, which has a large surface area, and therefore the heat-dissipating properties of the liquid crystal display device 1 can be further improved.

Figure 32:
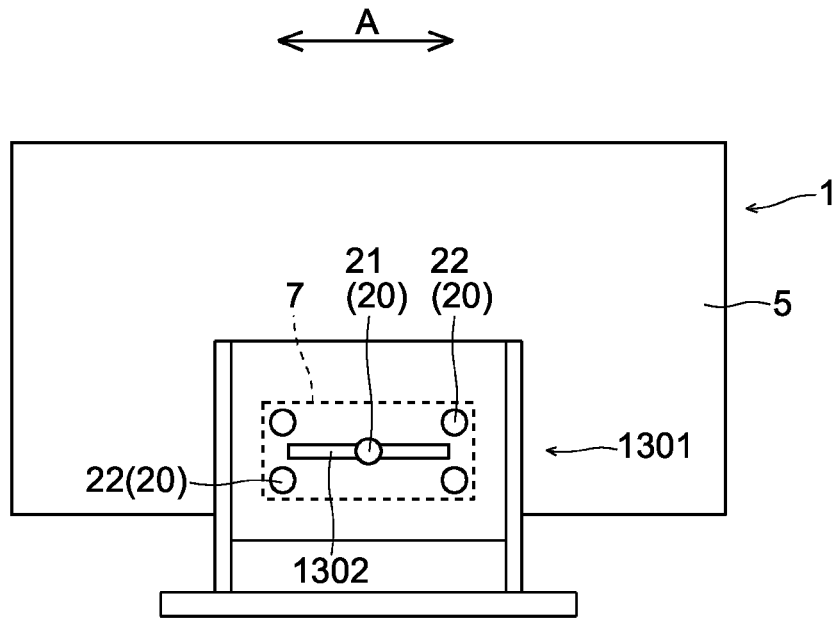
FIG. 32 is a back view showing the structure of a television receiver according to a seventh modification example of the present invention.
Figure 33:
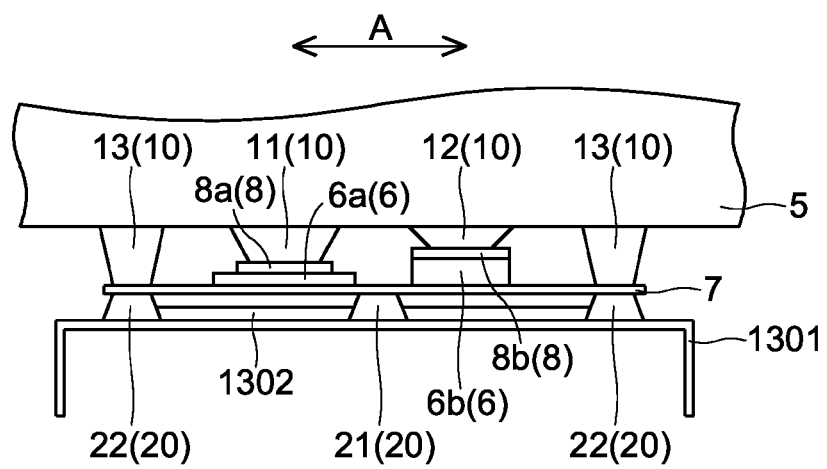
FIG. 33 is a plan view showing the structure in the vicinity of the substrate of FIG. 32.

A constitution like that of the television receiver according to a seventh modification example of the present invention shown in FIG. 32, for example, is also acceptable. Specifically, a reinforcing rib 1302 is formed on the support member 1301, as shown in FIG. 32 and FIG. 33. The reinforcing rib 1302 is preferably formed near the rib 21, and more preferably formed such that the rib 21 passes therethrough. According to this constitution, the strength of the support member 1301 can be improved, and therefore the occurrence of contact failure between the semiconductor elements 6 and the chassis 5 can be further suppressed.

Figure 34:
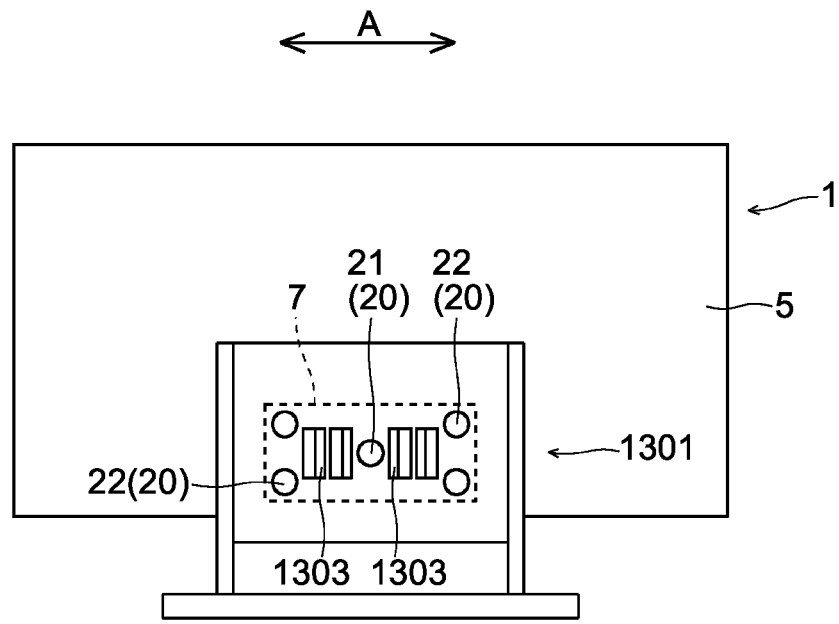
FIG. 34 is a back view showing the structure of a television receiver according to an eighth modification example of the present invention.
Figure 35:
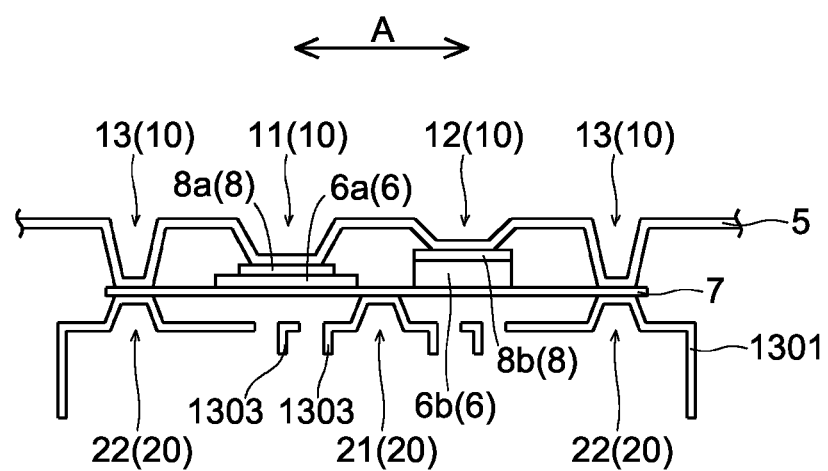
FIG. 35 is a cross-sectional view showing the structure in the vicinity of the substrate of FIG. 34, from the top side.
Figure 36:
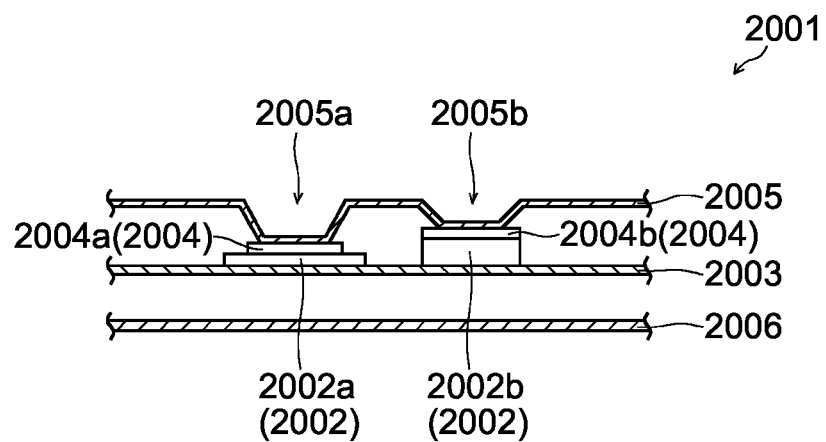
FIG. 36 is a cross-sectional view showing the structure of an electronic device according to a conventional example.
Figure 37:
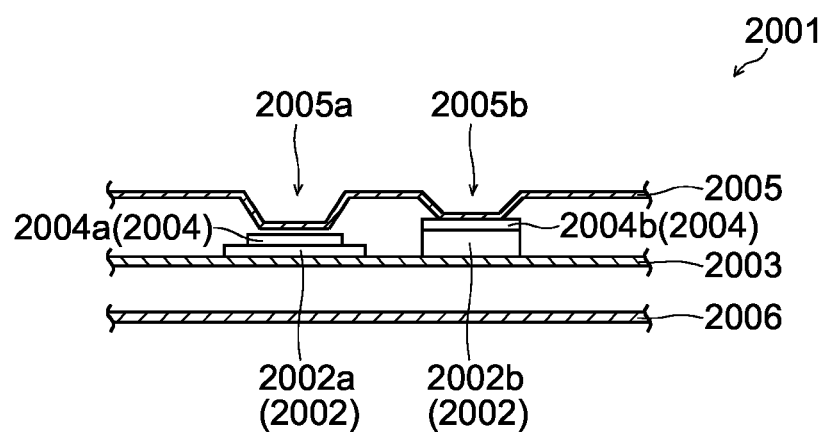
FIG. 37 is a cross-sectional view describing the structure of the electronic device according to the conventional example shown in FIG. 36.

A constitution like that of the television receiver according to an eighth modification example of the present invention shown in FIG. 34, for example, is also acceptable. Specifically, a plurality of fin parts 1303 that function as heat-dissipating fins are formed on the support member 1301, as shown in FIG. 34 and FIG. 35. The fin parts 1303 are formed in sections in the vicinity of the rib 21. As shown in FIG. 35, the fin parts 1303 are formed by bending parts of the support member 1301, and window parts are formed in the bent sections. By forming the plurality of fin parts 1303 on the support member 1301 in the aforedescribed manner, heat can be more easily dissipated from the support member 1301, and therefore the heat-dissipating properties of the liquid crystal display device 1 can be further improved. The fin parts 1303 are an example of the "heat-dissipating fin" of the present invention.

LIST OF REFERENCE SIGNS

1: liquid crystal display device (electronic device, display device)
5, 105, 205, 305, 405, 505, 605, 705, 805, 905, 1005, 1105: chassis (metal plate)
6, 6a, 6b: semiconductor element
7, 107, 207, 307: substrate
7a, 7b: element-mounting part
7c, 107c, 207c, 307c: center part
7d, 107d: edge part
8, 8a, 8b: heat-transmitting member (second heat-transmitting member)
9: pressing member (contact-inducing member)
11, 12: rib (first protruding part)
11a, 12a, 411a, 412a, 511a, 512a: contact part
13, 613, 813: rib (third protruding part)
21: rib (second protruding part)
130: screw (contact-inducing member)
230: band (contact-inducing member)
330: adhesive layer (contact-inducing member, first adhesive layer)
505a: flat face part (section of metal plate other than first protruding part)
505b, 505c: cutout part
411, 412, 511, 512, 811, 812, 911, 1011, 1012, 1111, 1112: protruding part (first protruding part, heat-dissipating fin)
411c, 412c: through-hole
411b, 412b, 511b, 512b: spring part (contact-inducing member)
413, 414: fin part (heat-dissipating fin)
540, 541, 1040, 1041, 1042, 1043: plate spring (first heat-transmitting member)
650: elastic body (first elastic body)
711, 712: protruding member (first protruding part)
750, 751: elastic body (second elastic body)
1140, 1141: metal tape (first heat-transmitting member)
1250, 1251: adhesive layer (second adhesive layer)
1301: support member (contact-inducing member)
1303: fin part (heat-dissipating fin)

The invention claimed is:

1. An electronic device provided with:
a semiconductor element;
a substrate to which the semiconductor element is attached; and
a metal plate disposed in opposition to the substrate and furnished with a first protruding part protruding towards the semiconductor element side;
the first protruding part including a contact part for contacting the semiconductor element;
a contact-inducing member for inducing the semiconductor element into contact with the contact part being furnished at least at a position corresponding to the center part of the substrate;
a third protruding part protruding towards the substrate side being furnished to the metal plate at a position thereof corresponding to an edge part of the substrate; and
the edge part of the substrate being attached to the third protruding part of the metal plate.

2. The electronic device according to claim 1, the contact-inducing member having a function of depressing the center part of the substrate towards the metal plate side.

3. The electronic device according to claim 2, the contact-inducing member including a pressing member disposed on the face of the substrate opposite the metal plate, and adapted to depress the center part of the substrate towards the metal plate side.

4. The electronic device according to claim 3, the pressing member including a second protruding part that protrudes towards the substrate side and that is adapted to depress the center part of the substrate.

5. The electronic device according to claim 2, the contact-inducing member including at least one of a screw and a band for attachment to the substrate and the metal plate.

6. The electronic device according to claim 1, the contact-inducing member including a spring part furnished at least to the first protruding part, and adapted to urge the contact part towards the semiconductor element side.

7. The electronic device according to claim 6, the first protruding part being formed by bending the metal plate.

8. The electronic device according to claim 6, a cutout part being formed at a periphery of the first protruding part of the metal plate; and the metal plate being furnished with a first heat-transmitting member that spans the cutout part and contacts the first protruding part and a section of the metal plate other than the first protruding part.

9. The electronic device according to claim 1, the contact-inducing member including a first adhesive layer for adhering the substrate and the metal plate to each other.

10. The electronic device according to claim 1, further comprising a first elastic body for adjusting a distance from the metal plate to the substrate furnished between the third protruding part and the substrate.

11. The electronic device according to claim 1, the metal plate being furnished with a heat-dissipating fin.

12. The electronic device according to claim 11, the heat-dissipating fin being formed by being cut from the metal plate.

13. The electronic device according to claim 1, the semiconductor element being furnished in a plurality;

the substrate including a plurality of element-mounting parts on which the plurality of semiconductor elements are mounted; and the contact-inducing member being furnished at least one of a position corresponding to the element-mounting parts and a position corresponding to a section between the plurality of element-mounting parts.

14. A television receiver provided with:

a display device including the electronic device according to claim 1; and a support member for supporting the display device;

the support member including the contact-inducing member for depressing the center part of the substrate towards the metal plate side.

15. The television receiver according to claim 14, the support member being furnished with a heat-dissipating fin.

16. An electronic device provided with:

a semiconductor element;

a substrate to which the semiconductor element is attached; and a metal plate disposed in opposition to the substrate and furnished with a first protruding part protruding towards the semiconductor element side;

the first protruding part including a contact part for contacting the semiconductor element;

a contact-inducing member for inducing the semiconductor element into contact with the contact part being furnished at least at a position corresponding to the center part of the substrate; and the first protruding part being attached to the metal plate interposed by a second elastic body for adjusting the distance from the first protruding part to the metal plate.

17. An electronic device provided with:

a semiconductor element;

a substrate to which the semiconductor element is attached; and a metal plate disposed in opposition to the substrate and furnished with a first protruding part protruding towards the semiconductor element side;

the first protruding part including a contact part for contacting the semiconductor element;

a contact-inducing member for inducing the semiconductor element into contact with the contact part being furnished at least at a position corresponding to the center part of the substrate;

a second heat-transmitting member being disposed between the semiconductor element and the first protruding part; and the first protruding part contacting the semiconductor element via the second heat-transmitting member.

18. The electronic device according to claim 17, a through-hole being formed in the contact part.

19. The electronic device according to claim 17, a second adhesive layer being disposed between the second heat-transmitting member and the first protruding part.

* * * * *